US012787817B2

(12) United States Patent
Moore et al.

(10) Patent No.: US 12,787,817 B2
(45) Date of Patent: Nov. 3, 2026

(54) METAL CORE SUBSTRATE BASED PACKAGE INTERCONNECT SYSTEMS

(71) Applicant: Lux Semiconductors, Inc., Albany, NY (US)

(72) Inventors: Chad B. Moore, Albany, NY (US); Graeme Housser, Albany, NY (US); Shane McMahon, Albany, NY (US)

(73) Assignee: Lux Semiconductors, Inc., Albany, NY (US)

(*) Notice: Subject to any disclaimer, the term of this patent is extended or adjusted under 35 U.S.C. 154(b) by 346 days.

(21) Appl. No.: 18/590,456

(22) Filed: Feb. 28, 2024

(65) Prior Publication Data

US 2024/0290705 A1 Aug. 29, 2024

Related U.S. Application Data

(60) Provisional application No. 63/487,345, filed on Feb. 28, 2023.

(51) Int. Cl.

| | |
|---|---|
| ***H10W 70/63*** | (2026.01) |
| ***G03F 7/00*** | (2006.01) |
| ***H05K 1/05*** | (2006.01) |
| ***H05K 3/44*** | (2006.01) |
| ***H10W 70/04*** | (2026.01) |
| ***H10W 70/60*** | (2026.01) |
| ***H10W 70/65*** | (2026.01) |
| ***H10W 70/68*** | (2026.01) |
| ***H10W 90/00*** | (2026.01) |

(52) U.S. Cl.

CPC ........ *H10W 70/635* (2026.01); *G03F 7/0035* (2013.01); *H05K 1/05* (2013.01); *H05K 3/44* (2013.01); *H10W 70/042* (2026.01); *H10W 70/65* (2026.01); *H10W 70/6875* (2026.01); *H10W 90/00* (2026.01); *H10W 70/60* (2026.01); *H10W 70/682* (2026.01); *H10W 90/796* (2026.01)

(58) Field of Classification Search

None

See application file for complete search history.

(56) References Cited

U.S. PATENT DOCUMENTS

2004/0160742 A1* 8/2004 Weiss ................. H01R 13/2414 361/714

2022/0385033 A1* 12/2022 Shi ...................... H01S 5/02469

* cited by examiner

*Primary Examiner* — Bo B Jang

(74) *Attorney, Agent, or Firm* — Stanzione & Associates, PLLC; Patrick J. Stanzione

(57) ABSTRACT

Metal core substrates made with a medal core patterned with metal in-substrate structures therethrough of the same metal and insolated from the metal core with dielectric in-substrate structures patterned therethrough can include interconnect structures deposited on top and back side surfaces thereof. The interconnect structures can include metal interconnect structures patterned therethrough which can connect with the metal in-substrate structures to create metal core substrate based package interconnect systems including various electronic, optical and other types of components within the metal core substrate based package interconnect systems. Multiple metal core substrate based package interconnect systems can be connected together through bonding or contacts. The metal core substrate based package interconnect systems can also include external electronic components connected thereto through contacts.

17 Claims, 10 Drawing Sheets

METAL CORE SUBSTRATE BASED PACKAGE INTERCONNECT SYSTEMS

REFERENCE TO RELATED APPLICATIONS

This application claims the benefit of Provisional Application No. 63/487,345, filed Feb. 28, 2023, entitled "SYSTEM ON FOIL." The benefit under 35 USC § 119(e) of the United States provisional application is hereby claimed, and the aforementioned provisional application is hereby incorporated herein by reference in its entirety.

STATEMENT REGARDING FEDERALLY SPONSORED RESEARCH OR DEVELOPMENT

Not applicable.

COPYRIGHT NOTICE

A portion of this disclosure contains material which is subject to copyright protection. The copyright owner has no objection to the photocopy reproduction by anyone of the patent document or the patent disclosure in exactly the form it appears in the Patent and Trademark Office patent file or records, but otherwise reserves all copyright rights whatsoever. 37 C.F.R 1.71(d).

BACKGROUND OF THE INVENTIVE CONCEPT

1. Field of the Invention

The present inventive concept relates to metal core substrate based package interconnect systems. More particularly, but not exclusively, the present inventive concept relates to metal core substrate based package interconnect systems fabricated with various electronic, optical and other type components therein.

Description of the Related Art

The high cost of advancing to the next semiconductor technology node (e.g., 5 nm) is changing the role of packaging in the electronics industry. With each new node, Moore's Law has historically fulfilled the economic and technological promises of density, speed, power, and cost scaling. However, these benefits are now slowing, and new packaging solutions are needed to maintain the pace of economic advantages previously met with silicon scaling.

Conductive through substrate vias are required for nearly all advanced packaging applications since successfully partitioning a System-on-Chip (SoC) design requires an abundance of Inputs/Outputs (I/Os). This is because SoC designs comprise millions of logic gates connected by complex networks of wires, in the form of multiple buses, complicated clock distribution networks, and control signals. Standard device I/Os impose pin-to-pin delays that degrade overall circuit performance. Moreover, using time-domain multiplexing (TDM) on standard I/Os to increase the virtual pin count by running multiple signals on each I/O imposes even greater latencies that can slow I/O speeds down by a factor of 4×-32× or more. TDM approaches also result in higher power consumption. When used to drive hundreds of package-to-package connections across PCB traces between multiple chips, standard device I/O pins carry a heavy power penalty compared to connecting logic nets on a monolithic die. These requirements all lead to a demand for vias through the substrate.

There are presently three options to achieve a feedthrough within an electronic substrate: Through Panel Vias (TPVs)—electrical conduits through printed circuit boards or organic substrates; Through Silicon Vias (TSVs)—electrically isolated copper traces through a thinned silicon wafer; and Through Glass Vias (TGVs)—metal filled holes through a glass wafer. All of the processing techniques to create conductive center pins for conductive through vias use electrodeposited copper or a conductive paste screen printing process that uses gold, silver or copper mixed with a glass powder and a polymer binder to form the conductive paste.

One issue with TPVs in printed circuit boards is the minimum resolution of wires (metal lines) and space is limited for larger features. Most printed circuit boards can pattern 4 mil (100 μm) or 3 mil (75 μm) lines and spacing and the state of the art is around 1.2 mil (30 μm), but at a very high premium price. Holes for through panel vias are limited to about 6 mils (150 μm). These large features mostly limit printed circuit boards to packaged components and do not allow for high resolution components, such as flip chip dies. Because of issues with electroplating copper to fill the large drilled holes in the printed circuit boards the TPVs are usually large barrel coated holes with an opening in the center of the via. One example of a TPV is described in U.S. Pat. No. 6,717,071 "Coaxial Via Hole and Process of Fabricating the Same."

Besides the high cost of TSV, they also have low mechanical strength. Because the silicon interposers are thinned down to create the TSV, they are weak and subject to cracking and breaking. When a silicon interposer package is increased in size and attached to a printed circuit board the coefficient of thermal expansion (CTE) mismatch between the silicon interposer and organic substrate can cause the bonding bumps to physically crack or break. The TSV can also warp, which can prevent fabrication or assembly, leading to phenomenons such as ball grid array (BGA) non-wets.

Through glass vias (TGVs), and to a lesser extent through silicon vias (TSVs), suffer from a lack of their ability to dissipate heat. The glass substrates in TGVs are insulators, thus only allowing heat to escape out of the top of the package. The TGVs are also not flexible, thus limiting their role in certain applications.

System-on-Foil, detailed in PCT/US20/54245 "System-on-Foil Device," included herein by reference, is a system-level advanced packaging technology designed to address the shortcomings of the current 2.5/3D packaging architecture. Within System-on-Foil and all advanced packages, there exists a substrate with multilevel wiring layers to allow surface mounted electronic components to communicate with one another.

However, an issue with using a metal substrate for HI is that larger pads and solder bumps attached to wiring layers on the metal substrate can capacitively couple to the substrate, therefore limiting the high-frequency bandwidth.

Accordingly, there is a need for circuit packages and circuit boards having substrate vias formed in System-on-Foil devices.

There is also a need for System-on-Foil devices having through substrate vias that allow power, ground, and signals to pass between electronic components inside the package and outside the package.

There is also a need for System-on-Foil devices which can pass signals, power and ground through the substrate.

There is also a need for System-on-Foil devices having a common metal shell as the substrate and one or more through via metal pins that are made from the same metal as the common metal shell.

There is also a need for System-on-Foil device structures which have isolative dielectric through vias which eliminate capacitive coupling between electronic devices disposed on opposite sides of the device structure.

There is also a need for a System-on-Foil fabrication process which removes capacitive coupling during the formation of the through metal vias (TMVs) therein.

There is also a need for System-on-Foil devices which provide lower latency.

There is also a need for System-on-Foil devices which provide increased bandwidth and data rate (GHz, Gbps).

There is also a need for System-on-Foil devices which provide lower power consumption (pJ/bit), higher routing density (# of lanes per mm/layer), and higher IO density ($10/mm^2$).

There is also a need for System-on-Foil devices which include interconnect layers of various thickness and width to support high speed digital, low speed digital, RF, power, current density.

There is also a need for System-on-Foil devices which provide low impedance power delivery networks with a patterned metal core power/ground co-plane.

There is also a need for System-on-Foil devices which provide low substrate warpage/high young's modulus substrate.

There is also a need for System-on-Foil devices which provide quick heat removal, hence high thermal conductivity.

There is also a need for System-on-Foil devices which provide thin dielectric layers between ground and power planes for power distribution networks (PDN).

There is also a need for System-on-Foil devices which provide 50 ohm impedance tuning, which cannot be met with deposition methods

SUMMARY OF THE INVENTIVE CONCEPT

The present general inventive concept provides semiconductor substrates and/or interposer packaging having through metal vias, and methods of making the same. More particularly, but not exclusively, the present inventive concept relates to semiconductor substrates and/or interposer packaging formed of a metal material and having metal through vias surrounded by a dielectric material, and methods of making the same.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a metal core substrate based package interconnect system (PIS), comprising: a metal core substrate with metal in-substrate structures patterned therein using the same metal body as the metal core substrate and a dielectric material patterned therein to isolate each of the metal in-substrate structures from the metal core substrate; and an interconnect structure bonded to each of a first surface of the metal core substrate and to a second surface of the metal core substrate, each interconnect structure including an insulation material patterned with a plurality of metal interconnect structures formed therethrough, at least one of the metal interconnect structures from one interconnect structure being electronically bonded to at least one metal in-substrate structure at the first surface of the metal core substrate and at least two metal interconnect structures from the other interconnect structure being electronically bonded to at least one metal in-substrate structure at the second surface of the metal core substrate to form at least one package interconnect component (PIC).

In an example embodiment, the at least one package interconnect component is a differential PIC.

In another example embodiment, the at least one package interconnect component is a signal array PIC.

In still another example embodiment, at least one of the package interconnect components is a multi-distribution PIC for one of a signal, power, or ground line.

In still another example embodiment, the at least one package interconnect component is an optical waveguide PIC.

In still another example embodiment, the at least one package interconnect component is an array PIC.

In still another example embodiment, the insulation material is an inorganic or organic dielectric material.

In yet another example embodiment, the metal core substrate based package interconnect system may further comprise a second metal core substrate based package interconnect system connected to the top surface thereof by bonding the interconnect structure on the top surface thereof to a back side interconnect structure of the second metal core substrate based package interconnect system such that metal interconnect structures from the metal core substrate based package interconnect system are electronically connected to interconnect structures of the second metal core substrate based package interconnect system.

In still another example embodiment, the metal core substrate based package interconnect system may further comprise a third metal core substrate based package interconnect system connected to a top surface of the second metal core substrate based package interconnect system through contacts configured to connect metal interconnect structures of the second metal core substrate based package interconnect system and metal interconnect structures of the third metal core substrate based package interconnect system.

In yet another example embodiment, the metal core substrate based package interconnect system may further comprise an electronic component attached to a top surface of the third metal core substrate based package interconnect system through contacts connected to metal interconnect structures patterned therein, wherein the electronic component receives signals through metal in-substrate structures patterned in the metal core substrate based package interconnect system, the second metal in-substrate structures patterned in the metal core substrate based package interconnect system and the third metal in-substrate structures patterned in the metal core substrate based package interconnect system.

In yet another example embodiment, the metal core substrate based package interconnect system may further comprise contacts connected to at least two exposed metal interconnect structures patterned in the interconnect structure bonded to the second surface of the metal core substrate; and a component attached to the two contacts to receive signals that pass through at least two metal in-substate structures before passing through the at least two exposed metal interconnect structures.

The foregoing and/or other features and utilities of the present general inventive concept may also be achieved by providing a metal core substrate based package interconnect system (PIS), comprising: a first metal core substrate including a metal core and metal in-substrate structures patterned therein using the same metal body as the metal core and dielectric in-substrate structures patterned therein to isolate each of the metal in-substrate structures from the metal core; and a second metal core substrate including a metal core and metal in-substrate structures patterned therein using the same metal body as the metal core and dielectric in-substrate structures patterned therein to isolate each of the metal in-substrate structures from the metal core, wherein at least part of the top surface of the second metal core substrate being bonded to at least part of the bottom surface of the first metal core substrate such that the at least one of the metal in-substrate structures of the first and second metal core substrates are aligned to form at least one single metal in-substrate structure and at least one single dielectric in-substrate structure.

In an example embodiment, the metal core substrate based package interconnect system (PIS) may further comprise a cavity formed in at least one of the top surface of the second metal core substrate and the back side surface of the first metal core substrate; and a component embedded within the cavity such that the component is electronically or optically connected to at least one of the metal in-substrate structures or dielectric in-substrate structures patterned through one of the first or second metal core substrates.

In another example embodiment, the metal core substrate based package interconnect system (PIS) may further comprise a third metal core substrate having at least part of a top surface thereof bonded to at least part of the back side surface of the second metal core substrate such that the at least one metal in-substrate structure of the third and second metal core substrates are aligned to form at least one single metal in-substrate structure and the component receives a signal through the metal in-substrate structures connected between the third and second metal core substrates.

In still another example embodiment, the metal core substrate based package interconnect system (PIS) may further comprise an interconnect structure deposited on the backside of the third metal core substrate and including at least one dielectric interconnect structure and at least one metal interconnect structure patterned therethrough and being aligned with and in contact with at least one respective in-substate dielectric structure and metal in-substrate structure of the third metal core substrate, wherein the component receives a signal through the metal in-substrate structures connected together from the second and third metal core substrates and through the at least one metal interconnect structure patterned through the interconnect structure.

In yet another example embodiment, the metal core substrate based package interconnect system (PIS) may further comprise an interconnect structure deposited on at least one of the top surface of the first metal core substrate and the backside of the second metal core substrate, the at least one interconnect structure including at least one dielectric interconnect structure and at least one metal interconnect structure patterned therethrough and being aligned with and in contact with at least one corresponding dielectric in-substrate structure and metal in-substrate structure of the metal core substrate in which the interconnect structure is deposited thereon.

In another example embodiment, the metal core substrate based package interconnect system (PIS) can further comprise contacts connected to at least two exposed metal interconnect structures patterned in an interconnect structure bonded to the top surface of the first metal core substrate; and a component attached to the two contacts to receive signals that pass through the first and second metal core substrates before passing through the at least two exposed metal interconnect structures.

Additional features and utilities of the present general inventive concept will be set forth in part in the description which follows and, in part, will be obvious from the description, or may be learned by practice of the general inventive concept.

BRIEF DESCRIPTION OF THE DRAWINGS

These and/or other features and utilities of the present inventive concept will become apparent and more readily appreciated from the following description of the embodiments, taken in conjunction with the accompanying drawings of which.

Figure 1:
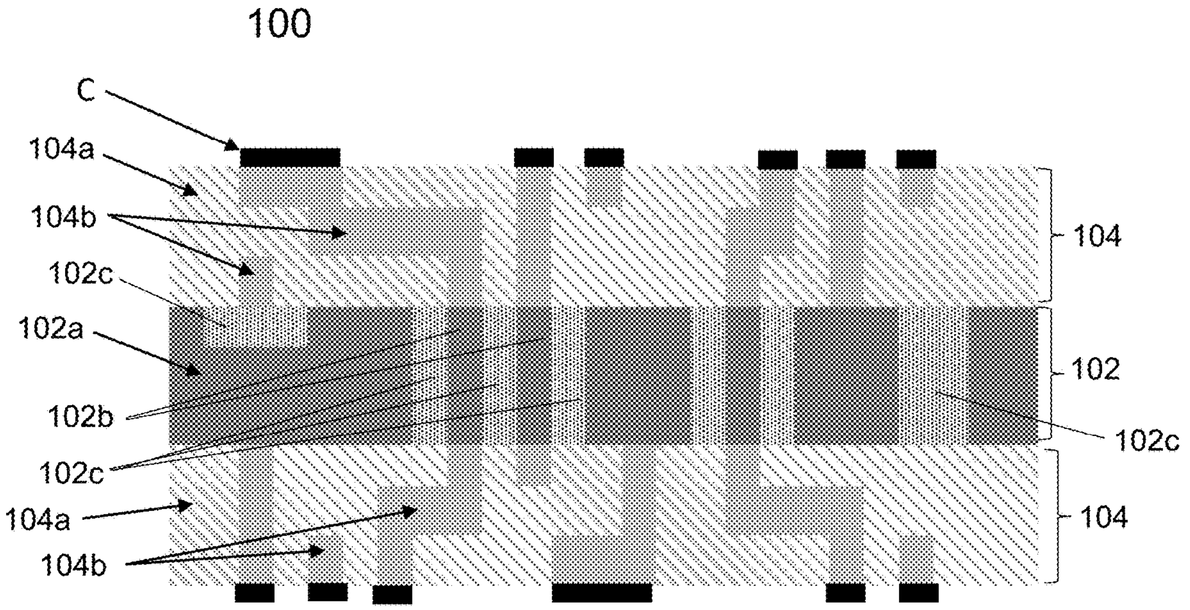
FIG. 1 illustrates a metal core substrate based package interconnect system 100 according to an example embodiment of the present inventive concept.

The drawings illustrate a few example embodiments of the present inventive concept and are not to be considered limiting in its scope, as the overall inventive concept may admit to other equally effective embodiments. The elements and features shown in the drawings are to scale and attempt to clearly illustrate the principles of exemplary embodiments of the present inventive concept. In the drawings, reference numerals designate like or corresponding, but not necessarily identical, elements throughout the several views.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. Also, while describing the present general inventive concept, detailed descriptions about related well-known functions or configurations that may diminish the clarity of the points of the present general inventive concept are omitted.

Reference will now be made in detail to the embodiments of the present general inventive It will be understood that although the terms "first" and "second" are used herein to describe various elements, these elements should not be limited by these terms. These terms are only used to distinguish one element from another element. Thus, a first element could be termed a second element, and similarly, a second element may be termed a first element without departing from the teachings of this disclosure.

Expressions such as "at least one of," when preceding a list of elements, modify the entire list of elements and do not modify the individual elements of the list.

All terms including descriptive or technical terms which are used herein should be construed as having meanings that are obvious to one of ordinary skill in the art. However, the terms may have different meanings according to an intention of the inventors, case precedents, or the appearance of new technologies. Also, some terms may be arbitrarily selected by the inventors, and in this case, the meaning of the selected terms will be described in detail in the detailed description herein. Thus, the terms used herein have to be defined based on the generally defined meaning of the terms together with the description throughout this specification.

Hereinafter, one or more exemplary embodiments of the present general inventive concept will be described in detail with reference to accompanying drawings.

Example embodiments of the present general inventive concept are directed to metal core substrate based package interconnect systems fabricated with various electronic, optical and other type components therein, such as, for example: through metal vias (TMVs) used, for example, to transmit signals, power, or ground through electrically isolated pins; dielectric isolation vias (DIVs) used, for example, to reduce or eliminate capacitive coupling between a component/bump and the metal substrate; power and ground planes used, for example, to route power and ground by patterning a plane within the metal substrate; passives used, for example, to fabricate components such as capacitors, resistors, inductors, and other components by using a metal core for at least a portion of each component; transmission lines used, for example, to route signal, power, and/or ground within the metal substrate to support high current densities or impedance matched interconnects; dielectric cutouts for redistribution layers (RDLs) used, for example, to provide additional dielectric thickness, beyond that within interconnect layers, for target impedance design; photonic vias and waveguides used, for example, to fabricate waveguides in metal core dielectric; heat spreader channels, used, for example, to increase convective or conductive heat dissipation by patterning a cavity in the metal substrate and leaving empty or filling with high thermal conductivity material; microfluidic channels and heat pipes, used, for example, to eliminate heat from the metal substrate by patterning a cavity in the metal substrate for microfluidic cooling; and antennas in a package formed of the same body as the metal core.

FIG. 1 illustrates a metal core substrate based package interconnect system 100 according to an example embodiment of the present inventive concept. Referring to FIG. 1, the metal core substrate based package interconnect system 100 can include a metal core substrate 102. This metal core substrate 102 can be formed from a material selected from a group consisting of: a) Molybdenum; b) Iron; c) Titanium; d) Chromium; e) Tantalum; f) Tungsten; g) Copper; h) Nickel; i) Vanadium; j) Aluminum; k) Cobalt; or any alloy comprised of a) through k). The metal core substrate 102 can be formed by laser ablating top and back side surfaces of a metal core **102*a* therein to etch trenches and pockets into the top and back surfaces of the metal core 102*a*. The etched trenches are preferably formed to create shaped metal pin surrounded by the trenches. The trenches and pockets can then be filled with a dielectric material 102*c*. This same process can be performed on the back side of the metal core 102*a* such that metal in-substrate structures 102*b* and dielectric in-substrate structures 102*c*** are formed therein. This process is described in U.S. patent application Ser. No. 18/446,841, filed on Aug. 9, 2023, by the Applicant of this patent application.

After the metal core substrate 102 is fabricated with metal in-substrate structures **102*b* and dielectric in-substrate structures 102*c* patterned therein an interconnect structure 104 can be fabricated on one or both the top and back surfaces of the metal core substrate 102. The interconnect structure(s) 104 can be formed to include different shaped dielectric interconnect and metal interconnect structures (104*a*, 104*b*) therein which can be aligned with different ones of the metal in-substrate structures 102*b* and dielectric in-substrate structures 102*c* patterned into the metal core 102*a* to form continuous transmission lines, and more importantly various different types of electronic, optical, liquid based, etc., circuit components within the substrate based package interconnect system 100, according to various example embodiments of the present inventive concept as described in detail below with reference to FIGS. 3-16**.

Figure 2:
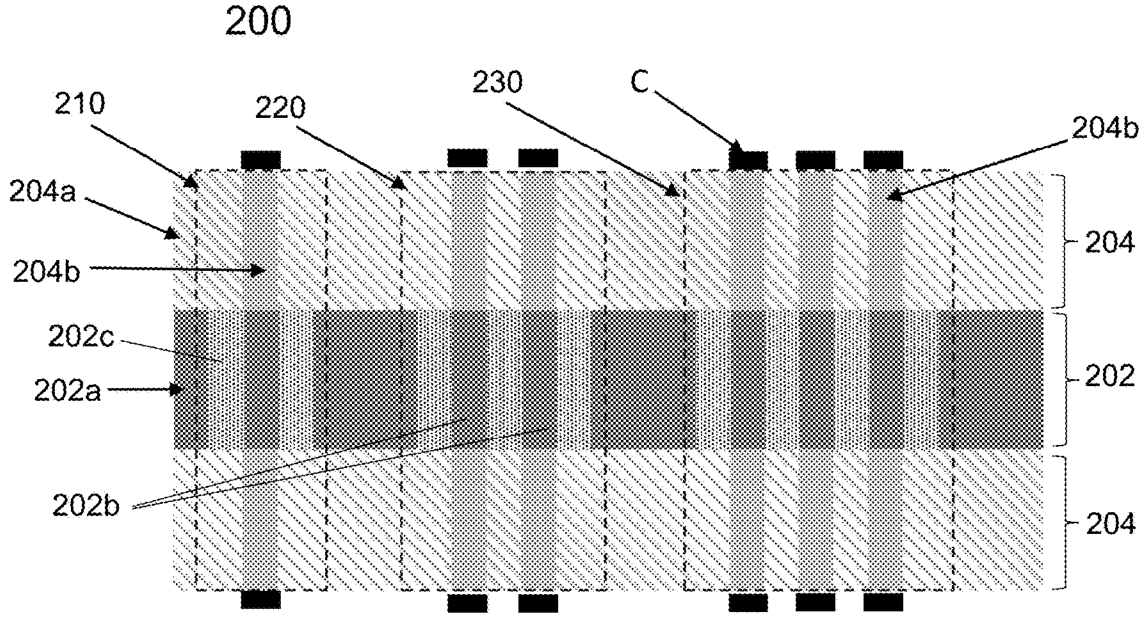
FIG. 2 illustrates a metal core substrate based package interconnect system 200 according to an example embodiment of the present inventive concept.

FIG. 2 illustrates a metal core substrate based package interconnect system 200 according to an example embodiment of the present inventive concept. Referring to FIG. 2, the metal core substrate based package interconnect system 200 can include a metal core substrate 202, which can be fabricated by a similar process as the metal core substrate 102 described with reference to FIG. 1. The metal core substrate 202 can include one or more metal in-substrate structures **202*b* formed as straight lines from a top surface to a back side thereof, each separated by dielectric in-substrate structures 202*c* such that the metal in-substrate structures 202*b* can be isolated from each other as well as the metal core 102*a*. On both the top surface and the back side of the metal core substrate 202 can be fabricated an interconnect structure 204 including patterned insulation material 204*a* and one or more metal interconnect lines 204*b*. It is to be noted that the interconnect structure 204** can be fabricated using an inorganic or organic dielectric material.

Due to its mechanical, temperature, and chemical compatibility with semiconductor processes, the metal core substrate can be made into wafer format in order to pattern high fidelity interconnect layers using lithographic patterning processes. As a result, lines and vias within the interconnect structure can be patterned more densely and at finer resolution than possible in non-wafer patterning techniques. The higher density of interconnects allows for an overall reduction in the number of interconnect layers that are required.

Additionally, more vias can be stacked using a wafer-based interconnect patterning process than in a conventional substrate build up process. Therefore, the combination of a reduced number of interconnect layers and an increased number of stacked vias can allow for interconnects to run entirely vertically through the package, as shown in 210, 220, and 230, improving performance. This is often not possible in conventional build up substrates, which required interconnects to be 'staggered' left or right to another set of stacked vias before continuing down through the substrate core.

Further, by using wafer-based interconnect patterning techniques, the interconnect line roughness can be significantly reduced, compared to non-wafer processes, which increases transmission line performance.

Due to the mechanical rigidity of the metal substrate, layer balancing between the topside and the backside is not required to the same extent as it is in organic substrate package technologies.

In this example embodiment an interconnect structure 204 is deposited on both the top surface and the back side of the metal core substrate 202 such that the patterned insulation material (also referred to herein as dielectric interconnect structures) 204*a* and a plurality of the metal interconnect structures 204*b* are fabricated on the top and bottom surfaces of the metal core substrate 202 to align with the dielectric in-substrate structures 202*c* and the metal in-substrate structures 202*b* of the metal core substrate 202. More specifically, with this configuration a single ended electronic transmission line 210 is an example of a package interconnect component which can be formed to extend through the metal core substrate based package interconnect system 200. The single ended electronic transmission line 210 can launch from one contact "C" disposed at either the top or the bottom of the metal core substrate based package interconnect system 200, connect with a first interconnect structure metal 204*b* within a first one of the interconnect structures 204, traverse through the interconnect structure 204, connect with a coaxial through metal via (TMV) 202*b*, connect with a second metal interconnect structure 204*b* within the second interconnect structure 204, traverse through the second interconnect structure 204 and then terminate at another contact C disposed at an opposite side of the metal core substrate based package interconnect system 200.

Coaxial Through Metal Vias can be formed in the substrate and designed for impedance matching to support high frequency single ended electronic transmission lines 210. By using the substrate metal as both the inner and outer conductor, these can be formed in higher density than would be capable in other substrate technologies. This further supports an overall reduced package size and layer count, when coupled with the high density wafer-based interconnects.

Additionally, Coaxial Through Metal Vias provide more area for signal and return currents to flow, especially at high frequency, which improves insertion loss and return loss relative to non-coaxial vias like through silicon vias, through glass vias, and through package vias. Also, since coaxial through metal vias are shielded from each adjacent via by a grounded metal core, there is no crosstalk between coaxial through metal vias, unlike through silicon vias, through glass vias, and through package vias.

Further, a differential electronic transmission line 220 is another example embodiment of a package system component which can be formed to extend through the metal core substrate based package interconnect system 200. The differential electronic transmission line 220 can be configured as a combination of signal, power and/or ground lines. The differential electronic transmission line 220 can launch from one of the contacts C disposed at either the top or the bottom of the metal core substrate based package interconnect system 200, connect with an interconnect structure metal 204*b* formed in a first one of the interconnect structures 204, traverse through the interconnect structure 204, connect with a differential coaxial TMV 202*b*, traverse through the differential coaxial TMV 204*b*, connect with an interconnect structure metal 204*b* formed in the second one of the interconnect structures 204, traverse through the second interconnect structures 204 and terminate at a contact C disposed at the opposite end of the metal core substrate based package interconnect system 200.

Impedance matched differential through vias can be formed in the substrate at higher density than competing substrate technologies, as a result of using the substrate metal as both the inner and outer conductors, and thus support a higher density of differential electronic transmission lines 220. This increased density, when coupled with wafer-based interconnects, allows for an overall reduction in package size.

Further, a signal array 230 is another example embodiment of a package system component which can be formed to extend through the metal core substrate based package interconnect system 200. The signal array 230 can launch from multiple contacts C disposed at one end of the metal core substrate based package interconnect system 200, connect with an interconnect structure metal 204*b*, traverse through the interconnect structure 204, connect with a TMV 202*b*, traverse through the metal core substrate 202, connect with an interconnect structure metal 204*b* formed in the second one of the interconnect structures 204, traverse through the interconnect structure 204 and terminate at multiple contacts disposed at the opposite side of the metal core substrate based package interconnect system 200.

The signal array 230 can be used to maximize routing density in the metal core substrate based package interconnect system, allowing for an overall reduction in package size.

Figure 3:
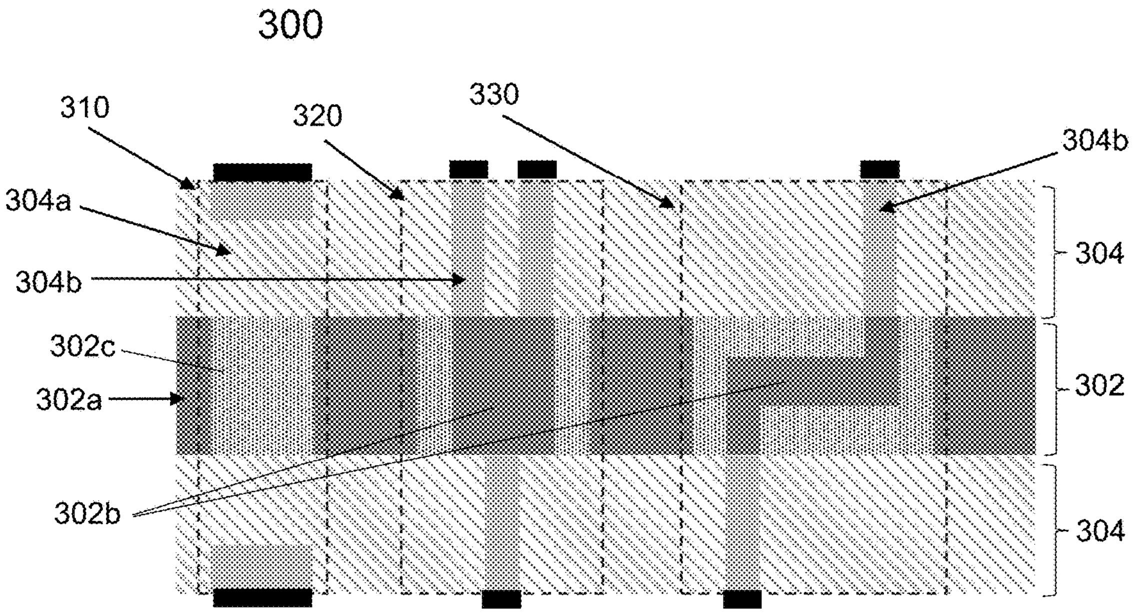
FIG. 3 illustrates a metal core substrate based package interconnect system 300 according to another example embodiment of a package system component.

FIG. 3 illustrates a metal core substrate based package interconnect system 300 according to another example embodiment of a package system component. Referring to FIG. 3, the metal core substrate based package interconnect system 300 can include an interconnect structure 304 deposited on both the top surface and the back side of a metal core substrate 302 such that patterned dielectric interconnect structures 304*a* and a plurality of the metal interconnect structures 304*b* are fabricated on the top and bottom surfaces of the metal core substrate 302 to align with respective ones of dielectric in-substrate structures 302*c* and metal in-substrate structures 302*b* of the metal core substrate 302. More specifically, with this configuration a decoupling circuit 310 is an example of a package interconnect component which can be formed to extend through the metal core substrate based package interconnect system 300. The decoupling circuit 310 can include an metal interconnect structure 304*b* formed in a first dielectric interconnect structure 304 fabricated on a top or back surface of a metal core substrate 302. The first dielectric interconnect structure 304 can include an metal interconnect structure 304*b*, a contact C disposed on the metal interconnect structure 304*b*, a dielectric interconnect structure 304*a* formed in the dielectric interconnect structure 304 below the metal interconnect structure 304*b*, an dielectric in-substrate structure 302*c* formed in the metal core substrate 302, and a second dielectric interconnect structure 304 fabricated on the other one of the top or back surface of the metal core substrate 302 and configured to mirror the first dielectric interconnect structure 304 with a contact C disposed on an metal interconnect structure 304*b* formed in the second dielectric interconnect structure 304. This decoupling package interconnect component 310 is formed to reduce capacitive coupling between the contact C (and any accompanying interconnect metal) and the metal core 302*a*.

The decoupling circuit 310 reduces parasitic capacitance between an interconnect structure, such as a contact, and the metal substrate. This increases the electronic performance of the package interconnect system for metal substrates.

Further, an isolated circuit 320, including a signal, power or ground line is another example embodiment of a package system component which can be formed to extend through the metal core substrate based package interconnect system 300. The isolated circuit 320 can include a pair of metal interconnect structures 304*b* which extend through the first interconnect structure 304 and connect with a metal in-substrate structure 302*b*, and another metal interconnect structure 304*b* which extends from the metal in-substrate structure 302*b* through the second interconnect structure 304 and can have another contact disposed at an opposite end thereof. The isolated circuit 320 can launch from at least one contact C, connect with interconnect structure metal 304*b*, traverse through the interconnect structure 304, connect with and traverse through an in-substrate plane 302*b*, connect with at least one interconnect structure metal 304*b* in the other one of the interconnect structures 304 and traverse through the interconnect structure 304 to terminate at the at least one contact C. This isolated circuit 320 type interconnect system component can provide a multiport connection from one side of the package system to the other side thereof.

The multi-distribution signal 320, power, or ground PIC allows for routing of signal, power, or ground within the substrate itself, for instance distributing power to multiple end points. This offers a low-resistivity isolated conduction path within the substrate which would otherwise need to occur within the interconnect structure layers, and thus can reduce the package size and the number of interconnect structure layers required.

Further, substrate interconnect electronic transmission line 330 is another example embodiment of a package system component which can be formed to extend through the metal core substrate based package interconnect system 300. The substrate interconnect electronic transmission line 330 can include aa metal interconnect structure 304*b* which extends through the first interconnect structure 304 and connects with an in-substrate waveguide 302*b* formed in the metal core substrate 302, and includes another metal interconnect structure 304*b* which extends from the in-substrate waveguide 302*b* through the second interconnect structure 304. The substrate interconnect electronic transmission line 330 can launch from a contact C, connect with the interconnect structure metal 304*b*, traverse through the interconnect structure 304, connect with and traverse through the in-substrate waveguide 302*b*, connect with the other interconnect structure metal 304*b* in the second interconnect structure 304 and traverse through the interconnect structure 304 to terminate at another contact C.

The substrate interconnect electronics transmission line 330 allows for routing of signal within the metal substrate which would otherwise need to occur within the interconnect structure layers, and thus can reduce the package size and the number of interconnect structure layers required. Moreover, the substrate interconnect transmission line 330 can be impedance matched, based on its geometry, to support high frequency signal transmission.

Figure 4:
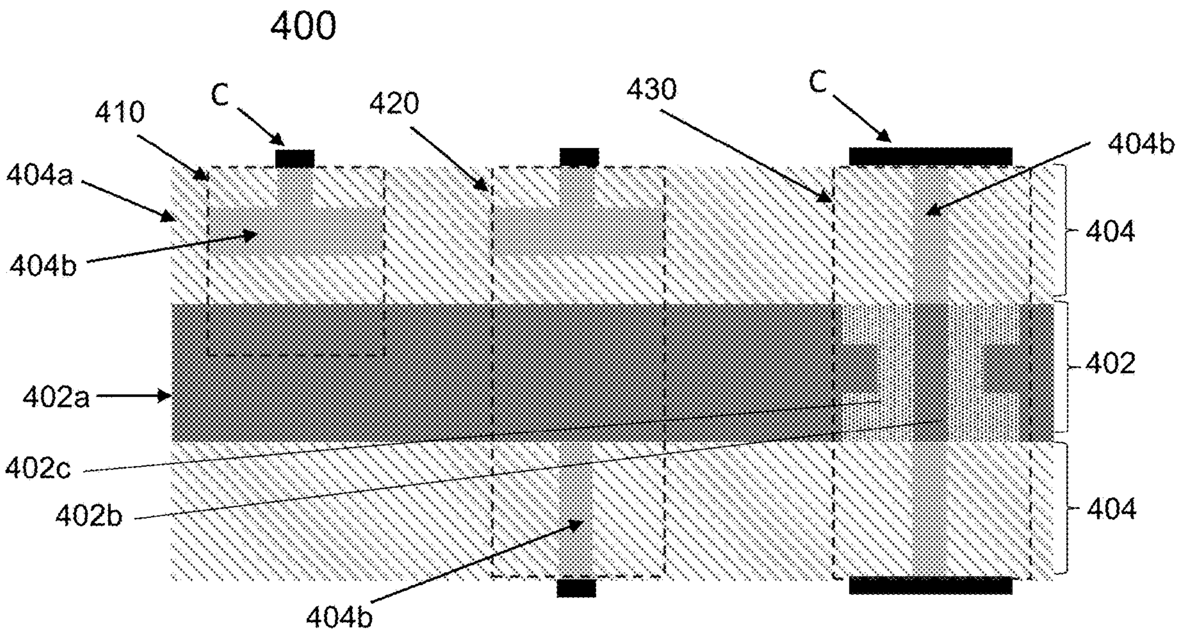
FIG. 4 illustrates a metal core substrate based package interconnect system 400 according to another example embodiment of the present inventive concept.

FIG. 4 illustrates a metal core substrate based package interconnect system 400 according to another example embodiment of the present inventive concept. Referring to FIG. 4, the metal core substrate based package interconnect system 400 can include an interconnect structure 404 deposited on both a top surface and a back side of a metal core substrate 402 such that patterned dielectric interconnect structures 404*a* and metal interconnect structures 404*b* can be fabricated on the top and back side surfaces of the metal core substrate 402 to form package interconnect components, as described in more detail below.

With the configuration of FIG. 4 a passive power line 410 is an example embodiment of a package interconnect component which can be formed to extend through the metal core substrate based package interconnect system 400. The passive power line 410 can include a dielectric in-substrate structure 404*a*, a metal interconnect structure 404*b*, and a metal core 402 portion of the metal core substrate 402. The passive power line 410 launches from a contact C disposed on the metal interconnect structure 404*b* and traverses through the metal interconnect structure 404*b* (which is formed as an electrode). The metal interconnect structure 404*b* can be located above or below the grounded metal core 402*a* with the dielectric interconnect structure 404*a* separating the two metal planes of the metal interconnect structure 404*b* and grounded metal core 402*a*. A passive power line 410 allows for capacitance to be formed between the metal substrate and interconnect structures above or below, which can be used to effect the electronic performance.

Alternatively, as illustrated by reference number 420, a power line can incorporate a partial isolated package interconnect component to supply a different power to the meal core 402 and instead use a ground supply from a contact C disposed at an end of a metal interconnect structure 404*b* formed through the second interconnect structure 402. A power line 420 allows for capacitance to be formed between the metal substrate and interconnect structures to serve as a decoupling capacitor between ground and a supplied voltage level.

Further, an Antipad 430, acting as a signal, power or ground line is another package example embodiment of a package system component which can be formed to extend through the metal core substrate based package interconnect system 300. In this example package interconnect component, the Antipad 430 can include an metal interconnect structure 404*b*, a metal in-substrate structure 402*b*, and another metal in-substrate structure 402*b*, wherein antipads are patterned into one or both metal core 402*a* surfaces/sides to reduce capacitive coupling between one or more contacts C and the metal core 402. Here the antipad launches from one contact C, connects with an metal interconnect structure 404*b* of one of the interconnect structures 404 and traverses through the interconnect structure 404, connects with a TMV 402*b* with antipads patterned into the surfaces/sides of the metal core 402_a_ and traverses through the TMV 402_b_, connects with the other one of the metal in-substrate structures 402_b_ and traverses through the other interconnect structure 404 and terminates at a contact C.

An antipad 430 serves to reduce the capacitance between the metal substrate and structures above or below the interconnect systems, such as a solder ball, bump, or microbump.

Figure 5:
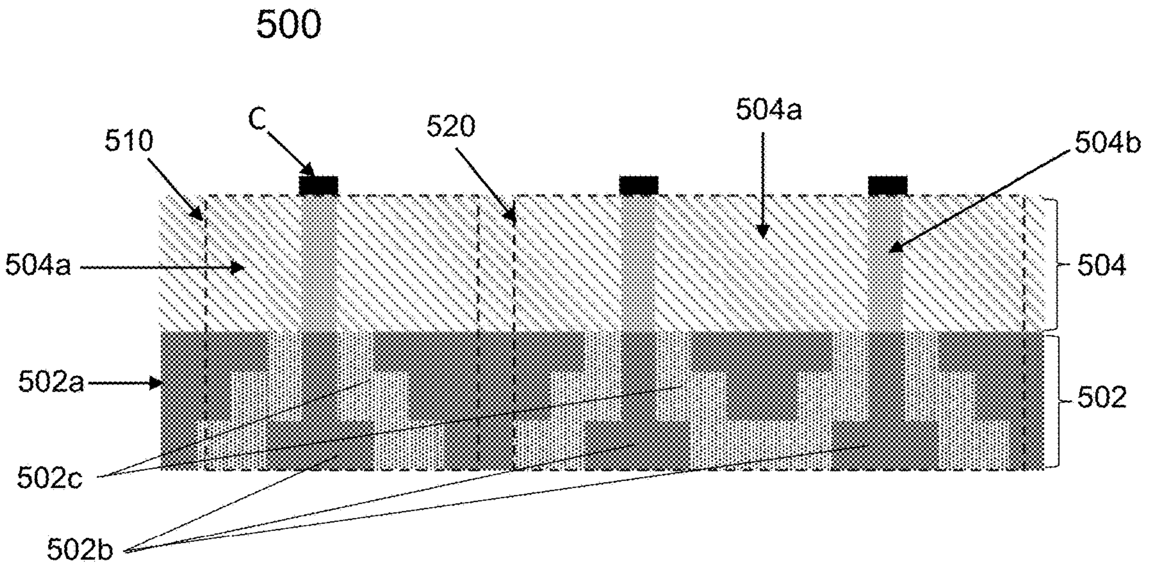
FIG. 5 illustrates a metal core substrate based package interconnect system 500 according to still another example embodiment of the present inventive concept.

FIG. 5 illustrates a metal core substrate based package interconnect system 500 according to still another example embodiment of the present inventive concept. Referring to FIG. 5, the metal core substrate based package interconnect system 500 can include an interconnect structure 504 deposited on a top surface of a metal core substrate 502 such that patterned dielectric interconnect structures 504_a_ and metal interconnect structures 504_b_ can be fabricated on the top of the metal core substrate 402 to form package interconnect components, as described in more detail below.

With the configuration of FIG. 5 a substrate antenna 510 is an example embodiment of a package interconnect component which can be formed to extend through the metal core substrate based package interconnect system 500. The metal core substrate 502 can include dielectric in-substrate structures 504_a_ patterned in a stepped formation to create stepped metal in-substrate structures 504_b_ patterned through the metal core substrate 502. The metal interconnect structures 504_b_ extend through the interconnect structure 504 to connect with predetermined ones of the metal in-substrate structures 504_b_ to create an antenna 510.

Here a transmission line launches from a contact C, connects with an metal interconnect structure 504_b_ and traverses through the interconnect structure 504, connects with a TMV 502_b_ patterned in a metal core 502_a_ of the metal core substrate 502, and radiates electromagnetic energy outward from the TMV 502_b_. This substrate antenna 510 can also be run in reverse as a receiver.

A substrate antenna 510 allows for antenna functionality within the substrate itself, which would otherwise need to be formed in the interconnect structure or attached to a surface. Embedding the antenna within the substrate itself can offer both performance and package size advantages.

Further, a substrate array 520 is another example embodiment of a package interconnect component which can be formed to extend through the metal core substrate based package interconnect system 500. In this example package interconnect component, a pair of electronic transmission lines launch from two or more contacts C connected to metal interconnect structures 504_b_, traverse through the interconnect structure 504, connect with and traverse through a TMV array (a pair of metal in-substrate structures 502_b_) and radiate electromagnetic energy outward from the TMV array. The Substrate Array 520 can also be run in reverse as a receiver. Further, the antennas 502_b_ within the array may or may not have metal between them. As shown, there is metal structure 502_b_ between them.

A substrate array 520 allows for antenna functionality within the substrate itself, which would otherwise need to be formed in the interconnect structure or attached to a surface. Embedding an antenna array within the substrate itself can offer both performance and package size advantages.

Figure 6:
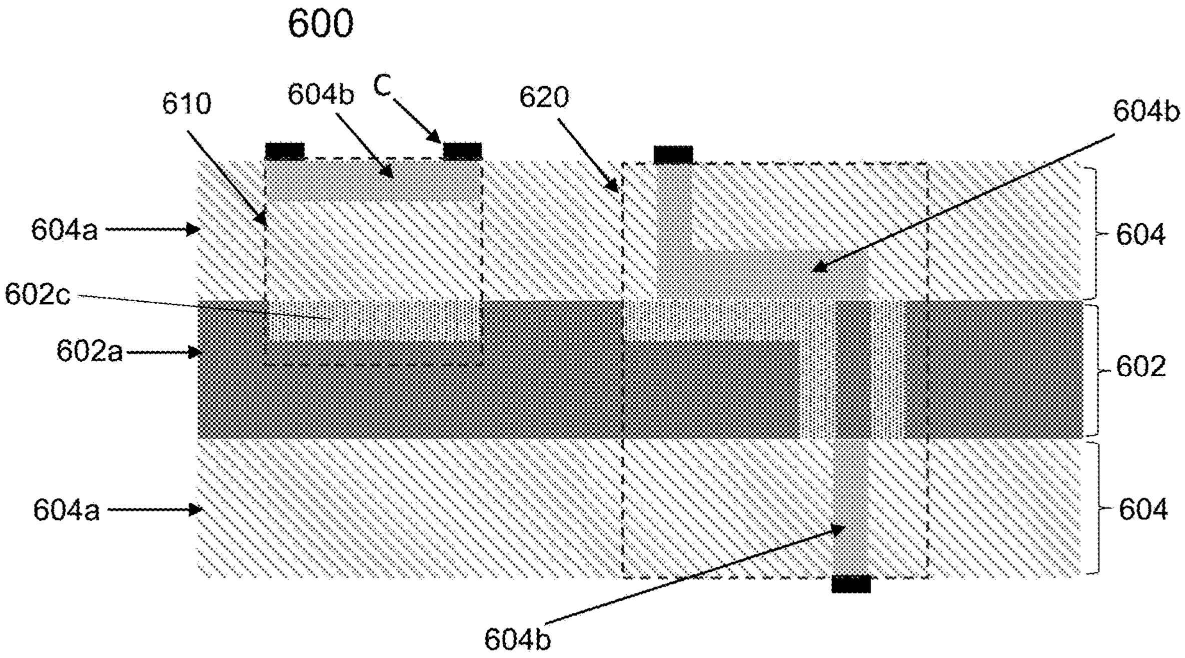
FIG. 6 illustrates a metal core substrate based package interconnect system 600 according to still another example embodiment of the present inventive concept.

FIG. 6 illustrates a metal core substrate based package interconnect system 600 according to still another example embodiment of the present inventive concept. Referring to FIG. 6, the metal core substrate based package interconnect system 600 can include an interconnect structure 604 deposited on top and back side surfaces of a metal core substrate 602 such that patterned dielectric interconnect structures 604_a_ and metal interconnect structures 604_b_ can be fabricated on the top of the metal core substrate 602, and in some cases on the back side of the metal core substrate 602 to form package interconnect components, as described in more detail below.

With the configuration of FIG. 6 a substrate reference 610 is an example embodiment of a package interconnect component which can be formed to extend through the metal core substrate based package interconnect system 600. Here an metal interconnect structure 604_b_ is fabricated to be isolated within a dielectric interconnect structure 604_a_ of a first interconnect structure 604, and an in-substrate dielectric isolation pocket (DIP) 602_c_ is patterned into a metal core 602_a_ of the metal core substrate 602. As a result of this configuration a transmission line is formed which launches from a contact C disposed in contact with the metal interconnect structure 604_b_ and traverses through the interconnect structure 604 located above the DIP 602_c_ using the metal core 602_a_ as a ground reference and terminates at another contact C connected to the same metal interconnect structure 604_b_.

A substrate reference 610 can be used to specifically tune the capacitance and impedance of interconnect structures above or below, by varying the depth and other geometries of the substrate reference, relative to the metal substrate surface.

Alternatively, a different substrate reference 620 can be formed with an metal interconnect structure 604_b_ fabricated within the first interconnect structure 604, an in-substrate dielectric isolation pocket (DIP) 602_c_ patterned into the metal core 602_a_ of the metal core substrate 602, a TMV 602_b_ surrounded by the DIP 602_c_, and a dielectric interconnect structure 604_a_ extending through the second interconnect structure 604. Here a transmission line is formed which launches from a contact C disposed on the metal interconnect structure 604_b_ of the first or second interconnect structure 604, traverses through the metal interconnect structure 604_b_ located above or below the DIP 602_c_, traverses through the TMV 602_b_, traverses through the metal interconnect structure 604_b_ formed in the other one of the metal interconnect structures 604_b_ located above or below the DIP 602_c_ and terminates at a second contact C.

This type of substrate reference 620 allows for tuning of capacitance and impedance of an interconnect structure that then traverses through the substrate, by varying the depth and other geometries of the substrate reference, relative to the metal substrate surface.

Figure 7:
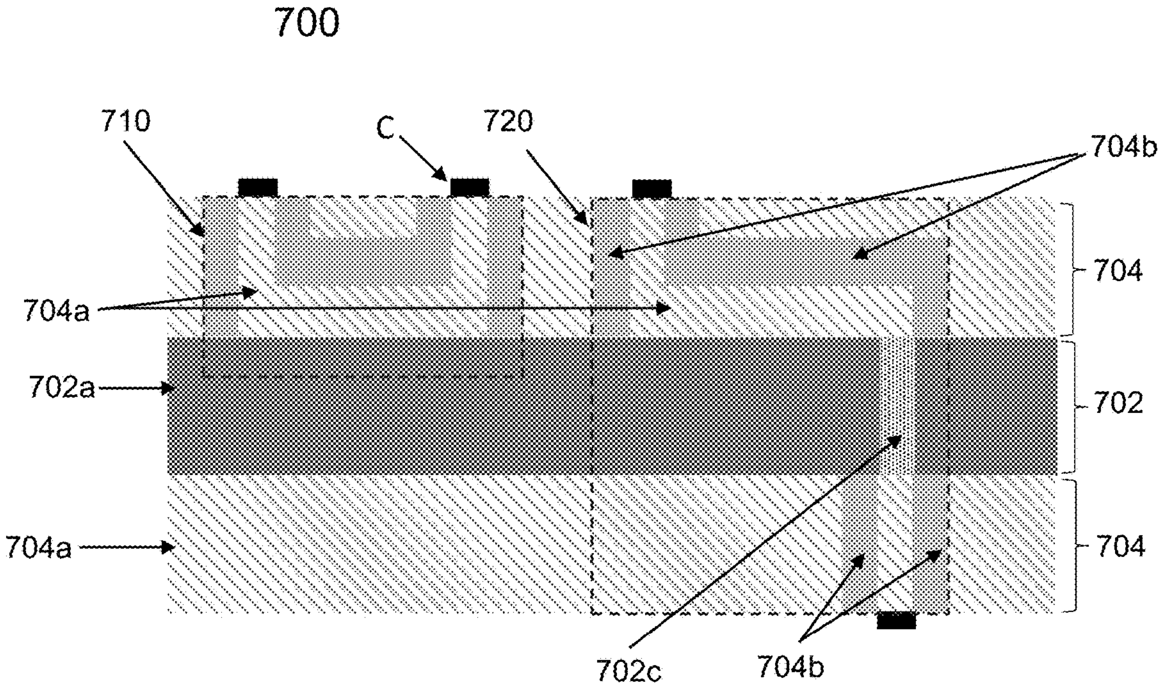
FIG. 7 illustrates a metal core substrate based package interconnect system 700 according to yet another example embodiment of the present inventive concept.

FIG. 7 illustrates a metal core substrate based package interconnect system 700 according to yet another example embodiment of the present inventive concept. Referring to FIG. 7, the metal core substrate based package interconnect system 700 can include an interconnect structure 704 deposited on top and back side surfaces of a metal core substrate 702 such that patterned dielectric interconnect structures 704_a_ and metal interconnect structures 704_b_ can be fabricated on the top of the metal core substrate 702, and in some cases on the back side of the metal core substrate 702 to form package interconnect components, as described in more detail below.

With the configuration of FIG. 7 a photonic optical waveguide 710 is an example embodiment of a package interconnect component which can be formed to extend through the metal core substrate based package interconnect system 700. Here a first metal interconnect structure 704_b_ can be fabricated to be isolated within a first interconnect structure 704. Second and third metal interconnect structures 704_b_ can be fabricated to extend through the interconnect structure 704 to contact a metal core 702*a* of a metal core substrate 702, where the second and third metal interconnect structures 704*b* are disposed adjacent to each side of the first metal interconnect structure 704*b*, respectively. Here one contact C is disposed in contact with both the first metal interconnect structure 704*b* and the second metal interconnect structure 704*b* and a second contact is disposed on contact with both the first metal interconnect structure 704*b* and the third metal interconnect structure 704*b*. With this configuration an optical waveguide is formed which launches from one contact C and connects with an interconnect system dielectric 704*a* that is surrounded by the metal interconnect structures 704*b*, traverses through the interconnect structure 704 while always being surrounded by either metal core metal 702*a* and/or metal interconnect structures 704*b* and terminates at the other contact C.

A photonic optical waveguide 710 in this configuration allows for the transmission of photonic signals within the interconnect structure dielectric material, encased in interconnect structure metal.

Further, a photonic optical waveguide 720 is another example embodiment of a package interconnect component which can be formed to extend through the metal core substrate based package interconnect system 700. Here a dielectric in-substrate structure 702*c* is formed through the metal core substrate 702. A first metal interconnect structure 704*b* can be fabricated to extend through the first interconnect structure 704 to contact the metal core 702*a* at one side of the dielectric in-substrate structure 702*c* of a metal core substrate 702, and a second metal interconnect structure 704*b* can be fabricated to extend through the first interconnect structure 704 to contact the metal core 702*a* at an opposite side of the dielectric in-substrate structure 702*c* of a metal core substrate 702. Between the first and second metal interconnect structures 704*b* can be disposed a contact C on the surface of the interconnect structure 704. Through the second interconnect structure 704, which is disposed on the back side of the metal core substrate 702, are a pair of metal interconnect structures 704*b*, a first one of the pair of metal interconnect structures 704*b* being in contact with the metal core 702*a* at one side of the dielectric in-substrate structure 702*c* of a metal core substrate 702, and the second one of the pair of metal interconnect structures 704*b* being in contact with the metal core 702*a* at the opposite side of the dielectric in-substrate structure 702*c* of a metal core substrate 702. Between the pair of metal interconnect structures 704*b* is a contact C disposed on the surface of the second interconnect structure 704. With this configuration the photonic optical waveguide 720 can launch from one contact C and connect with the dielectric interconnect structure 704*a* that is surrounded by two metal interconnect structures 704*b*, traverse through the interconnect structure 704 (always being surrounded by either metal core metal 702*a* and/or metal interconnect structures 704*b*), connect with the dielectric in-substrate structure 702*c* and traverse therethrough, connect with the dielectric interconnect structure 704*a* that is surrounded by the pair of metal interconnect structures 704*b* in the second interconnect structure 704, traverse through the second interconnect structure 704 and terminate at the other contact C.

A photonic optical waveguide 720 can also be configured to transmit photonic signals within the interconnect structure dielectric material, which then traverses through the substrate to a photonic optical waveguide on the other side, thus allowing for through substrate optical transmission.

Figure 8:
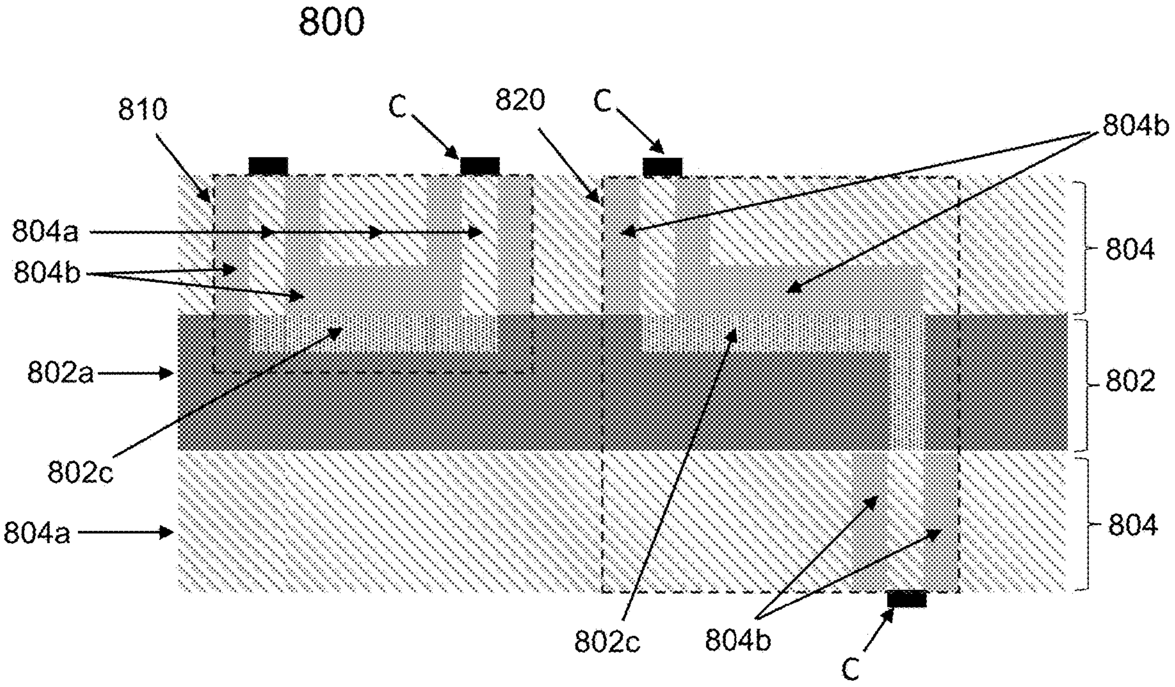
FIG. 8 illustrates a metal core substrate based package interconnect system 800 according to yet another example embodiment of the present inventive concept.

FIG. 8 illustrates a metal core substrate based package interconnect system 800 according to yet another example embodiment of the present inventive concept. Referring to FIG. 8, the metal core substrate based package interconnect system 800 can include an interconnect structure 804 deposited on top and back side surfaces of a metal core substrate 802 such that patterned dielectric interconnect structures 804*a* and metal interconnect structures 804*b* can be fabricated on the top of the metal core substrate 802, and in some cases on the back side of the metal core substrate 802 to form package interconnect components, as described in more detail below.

With the configuration of FIG. 8 a photonic optical waveguide 810 is an example embodiment of a package interconnect component which can be formed to extend through the metal core substrate based package interconnect system 800. Here the metal core substrate 802 can have a dielectric isolation pocket (DIP) 802*c* fabricated into a top surface thereof. A U-shape metal interconnect structure 804*b* can be fabricated within a first interconnect structure 804 such that a bottom portion of the U-shaped metal interconnect structure 804*b* is in contact with the DIP 802*c*. Also within the interconnect structure 804 can be formed two vertical metal interconnect structures 804*b* extending from a top surface thereof to the metal core 802*a* of the metal core substrate 802, wherein one vertical metal interconnect structures 804*b* is fabricated adjacent to each outer side of the U-shape metal interconnect structure 804*b*. A contact C can be disposed between one vertical metal interconnect structure 804*b* and one end of the U-shaped metal interconnect structure 804*b* and a second contact C can be disposed between the other vertical metal interconnect structure 804*b* and an opposite end of the first U-shaped metal interconnect structure 804*b*. With this configuration the photonic optical waveguide 810 can launch from one contact C and connect with the dielectric interconnect structure 804*a* that is surrounded by two metal interconnect structures 804*b*, traverse through the dielectric interconnect structure 804*a*, connect with the DIP 802*c* surrounded by the metal interconnect structures 804*b* and traverse through the DIP 802*c*, connect with and traverse through the dielectric interconnect structure 804*a* surrounded by the metal interconnect structures 804*b* and terminate at the other contact C.

Another configuration of photonic optical waveguide 810 allows for transmission of photonic signals within the interconnect structure dielectric material, which then traverses within the substrate, not-through, to another photonic optical waveguide on the same side.

Further, a photonic optical waveguide 820 is another example embodiment of a package interconnect component which can be formed to extend through the metal core substrate based package interconnect system 800. Here a dielectric isolation pocket (DIP) 802*c* is formed to extend across a top surface of the metal core 802*a* of the metal core substrate 802 and then turn downward and through a dielectric in-substrate structure the metal core 802*a*. A first metal interconnect structure 804*b* can be fabricated to extend through the first interconnect structure 804 to contact the metal core 802*a* at one end of the DIP 802*c*, and a second metal interconnect structure 804*b* can be fabricated to extend through the first interconnect structure 804 to contact the DIP 802*c* and then turn and extend along the entire upper surface of the DIP 802*c* until making contact with the metal core 802*a* at an opposite end of the DIP 802*c*. Between the first and second metal interconnect structures 804*b* can be disposed a contact C on the surface of the interconnect structure 804. Through the second interconnect structure 804, which is disposed on the back side of the metal core substrate 702, are a pair of metal interconnect structures

804*b* A first one of the pair of metal interconnect structures 804*b* being in contact with the metal core 802*a* at one side of the DIP 802*c* and the second one of the pair of metal interconnect structures 804*b* being in contact with the metal core 802*a* at the opposite side of the DIP 802*c*. Between the pair of metal interconnect structures 804*b* and on the surface of the second interconnect structure 804 can be disposed another contact C. With this configuration the photonic optical waveguide 820 can launch from one contact C and connect with the dielectric interconnect structure 804*a* that is surrounded by two metal interconnect structures 804*b*, traverse through the interconnect structure 804, connect with the DIP 802*c* and traverse therethrough, connect with the dielectric interconnect structure 804*a* that is surrounded by the pair of metal interconnect structures 804*b* in the second interconnect structure 804, traverse through the second interconnect structure 804 and terminate at the other contact C.

Another configuration of photonic optical waveguide 820 allows for transmission of photonic signals within the interconnect structure dielectric material, which then traverses within the substrate, and then through the substrate, to a photonic optical waveguide within the interconnect structure on the opposite side.

Figure 9:
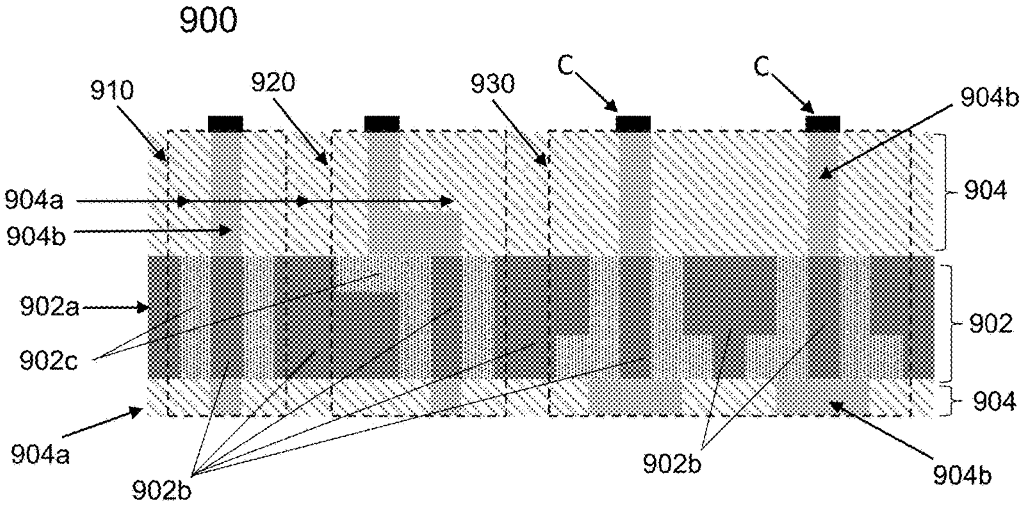
FIG. 9 illustrates a metal core substrate based package interconnect system 900 according to still another example embodiment of the present inventive concept.

FIG. 9 illustrates a metal core substrate based package interconnect system 900 according to still another example embodiment of the present inventive concept. Referring to FIG. 9, the metal core substrate based package interconnect system 900 can include an interconnect structure 904 deposited on top and back side surfaces of a metal core substrate 902 such that patterned dielectric interconnect structures 904*a* and metal interconnect structures 904*b* can be fabricated on the top and the back side of the metal core substrate 902 to form package interconnect components, as described in more detail below.

With the configuration of FIG. 9 an antenna 910 is an example embodiment of a package interconnect component which can be formed to extend through the metal core substrate based package interconnect system 900. Here the metal core substrate 902 includes dielectric in-substrate structures 902*c* and an metal in-substrate structure 902*b* patterned into a metal core 902*a*. An metal interconnect structure 904*b* can be fabricated to extend through the interconnect structure 904 deposited on the top surface of the metal core substrate 902 to contact the metal in-substrate structure 902*b*. Another metal interconnect structure 904*b* can be fabricated to extend through the interconnect structure 904 deposited on the back side of the metal core substrate 902 to contact the same metal in-substrate structure 902*b*. A contact C can be disposed on the end of the metal interconnect structure 704*b* formed through the interconnect structure 904 deposited on the top surface of the metal core substrate 902. With this configuration an electronic transmission line is formed which launches from the contact C and connects with the metal interconnect structure 704*b*, traverses through the interconnect structure 904, connects with and traverses through a TMV 902*c*, connects with and traverses through the metal interconnect structure 704*b* formed through the interconnect structure 904 deposited on the back side of the metal core substrate 902 and radiates electromagnetic energy out of the antenna 910.

An antenna 910 can be formed within the interconnect structure above or below a dielectric in-substrate structure, allowing for communication to that antenna from the opposite side of the substrate.

Further, a different type of antenna 920 is another example embodiment of a package interconnect component which can be formed to extend through the metal core substrate based package interconnect system 900. Here the metal core substrate 902 includes an dielectric in-substrate structure 902*c* patterned through the metal core 902*a*, wherein the dielectric in-substrate structure 902*c* includes a dielectric insolation pocket (DIP) pattered along the top surface of the metal core 902*a*, and an metal in-substrate structure 902*b* patterned through the dielectric in-substrate structure 902*c* with the dielectric insolation pocket (DIP) disposed to one side of the metal in-substrate structure 902*b*. An metal interconnect structure 904*b* can be fabricated to extend through the interconnect structure 904 deposited on the top surface of the metal core substrate 902 down to the DIP 902*c* and then extend along the DIP 902*c* until making contact with the metal in-substrate structure 902*b*. Another metal interconnect structure 904*b* can be fabricated to extend through the interconnect structure 904 deposited on the back side of the metal core substrate 902 to contact the same metal in-substrate structure 902*b*. A contact C can be disposed on the end of the metal interconnect structure 904*b* formed through the interconnect structure 904 deposited on the top surface of the metal core substrate 902.

With this configuration an electronic transmission line can launch from the contact C and connect with and traverse through the metal interconnect structure 904*b* formed through the interconnect structure 904 deposited on the top surface of the metal core substrate 902 using the metal core 902 as a ground reference, connect with the TMV 902*b*, connects with the and traverses through the metal interconnect structure 904*b* formed through the interconnect structure 904 deposited on the back side of the metal core substrate 902 and radiates electromagnetic energy out of the antenna 920.

An antenna 920 can be formed within the interconnect structure which can be electronically connected through a dielectric in-substrate structure, to interconnect structures on the opposite side that may route the signal through the package.

Further, an Array 930 is still another example embodiment of a package interconnect component which can be formed to extend through the metal core substrate based package interconnect system 900. Here the metal core substrate 902 includes dielectric in-substrate structures 902*c* patterned through the metal core 902*a* and a pair of metal in-substrate structures 902*b* patterned through the dielectric in-substrate structure 902*c* and an metal in-substrate plane structure 902*b* disposed between the pair of metal in-substrate structures 902*b* and separated therefrom by the dielectric in-substrate structures 902*c*. A pair of metal interconnect structure 904*b* can be fabricated to extend through the interconnect structure 904 deposited on the top surface of the metal core substrate 902 down to make contact with a corresponding one of the metal in-substrate structure 902*b*. Another pair of metal interconnect structures 904*b* can be patterned through the interconnect structure 904 deposited on the back side of the metal core substrate 902 and formed to make contact with corresponding ones of the metal in-substrate structures 902*b*. A contact C can be disposed on the end of each of the metal interconnect structures 904*b* formed through the interconnect structure 904 deposited on the top surface of the metal core substrate 902.

In this example package interconnect component, a pair of electronic transmission lines can launch from two or more contacts C connected to metal interconnect structures 904*b*, traverse through the interconnect structure 904, connect with and traverse through a TMV array (a pair of metal in-substrate structures 902*b*), connect with interconnect system metal structures 904*b* patterned through the interconnect structure 904 deposited on the back side of the metal core substrate 902 and radiate electromagnetic energy outward from the TMV array. The Array 930 can also be run in reverse as a receiver. Further, the antennas 902*b* within the array may or may not have metal between them. As shown, there is metal structure 502*b* between them.

An antenna array 930 can be formed within the interconnect structure above or below a dielectric in-substrate structure array, allowing for communication to the array from the opposite side of the substrate. A substrate reference, or cutaway within the metal substrate, can be used to tune the capacitance of the antennas relative to the metal substrate.

Figure 10:
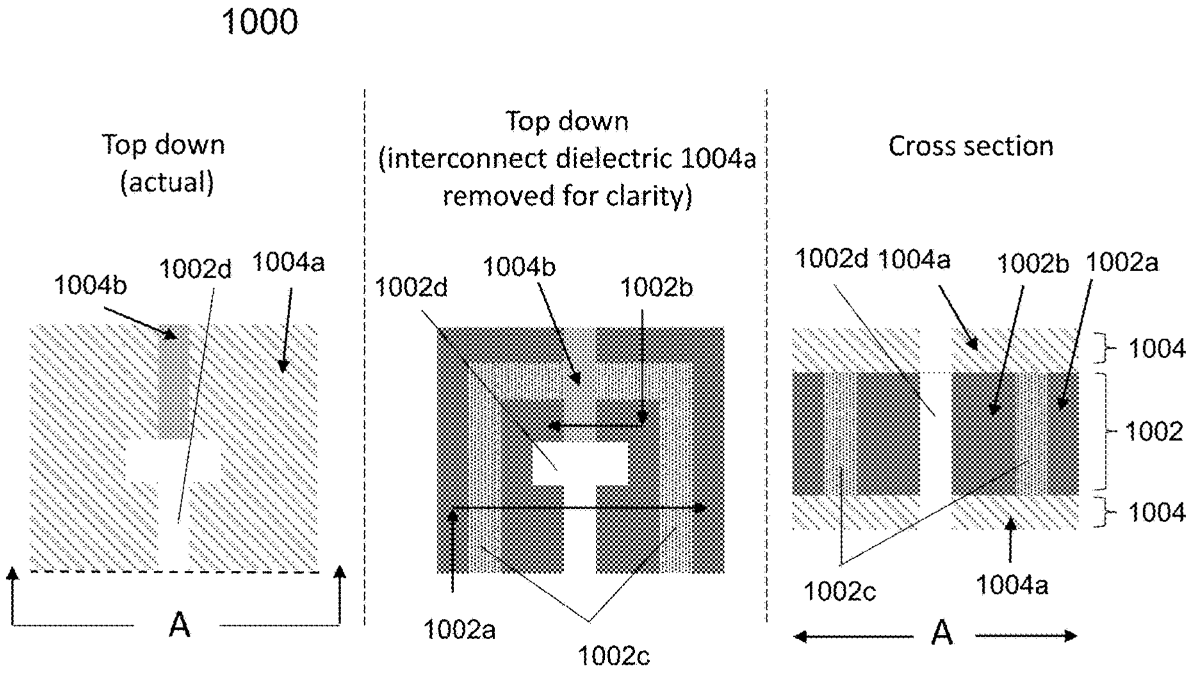
FIG. 10 illustrates a metal core substrate based package interconnect system 1000 according to an example embodiment of the present inventive concept.

FIG. 10 illustrates a metal core substrate based package interconnect system 1000 according to an example embodiment of the present inventive concept. Referring to FIG. 10, the metal core substrate based package interconnect system 1000 can include a metal core substrate 1002 formed from a metal core 1002*a*. The metal core 1002*a* can be etched (i.e. laser ablated) at the top and back side surfaces therein to etch trenches and pockets into the top and back surfaces of the metal core 1002*a*. The etched trenches are preferably formed to create shaped metal pins surrounded by the trenches. The trenches and pockets can then be filled with a dielectric material 1002*c*. This same process can be performed on the back side of the metal core 1002*a* such that metal in-substrate structures 1002*b* and dielectric in-substrate structures 1002*c* are formed therein, and thereby electrically isolate one region of the metal core substrate 1002*a* from another region of the metal core substrate 1002*b*.

Within an electrically isolated region of the metal core substrate 1002, the metal core 1002*b* can be etched (i.e. laser ablated) at the top and back side surfaces therein to etch trenches into the top and back surfaces of the metal core 1002*b*. The etched trenches are preferably formed to create shaped cavities 1002*d* that remain unfilled to serve as ports for electrical or optical connectors.

On both the top surface and the back side of the metal core substrate 1002 can be fabricated an interconnect structure 1004 including patterned dielectric interconnect structures 1004*a* and one or more metal interconnect structures 1004*b*. Here patterned dielectric interconnect structures 1004*a* are fabricated on the top and bottom surfaces of the metal core substrate 1002, not including above or below cavity 1002*d*, while a single metal interconnect structure 1004*b* is fabricated only on the top surface of the metal core substrate 1002. Here, as described from the top down of the center image of FIG. 10, the metal interconnect structure 1004*b* traverses atop a dielectric interconnect structure 1004*a* deposited atop metal core 1002*a*, then continues atop a dielectric interconnect structure 1004*a* deposited atop metal core 1002*c*, then then continues atop a dielectric interconnect structure 1004*a* deposited atop metal core 1002*b*, and finally traverses through dielectric interconnect structure 1004*a* to connect with metal core 1002*b*, thereby enabling signal transfer to and from the connector.

This embodiment allows for creation of mechanical connection interfaces, or connectors, such that an external component or connector can mechanically seat itself within the receiving cavity, with electrical terminations, formed within the metal core based package interconnect system.

Figure 11:
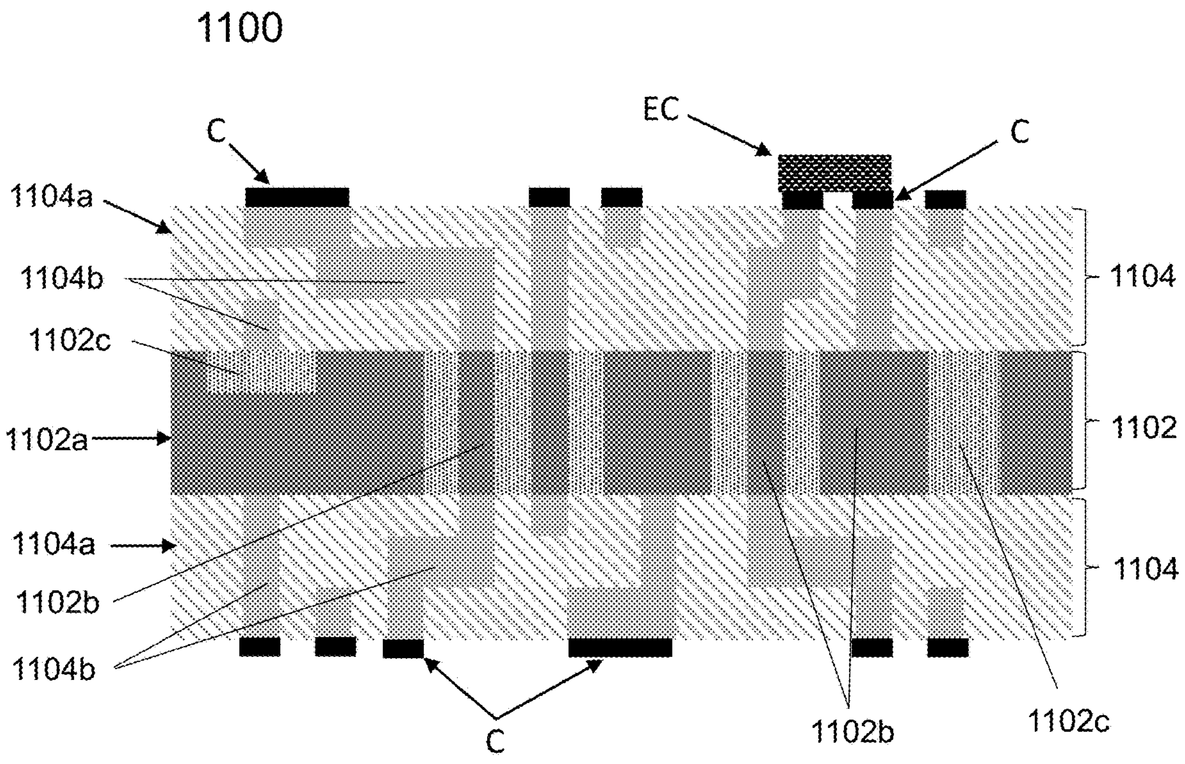
FIG. 11 illustrates a metal core substrate based package interconnect system 1100 according to still another example embodiment of the present inventive concept.

FIG. 11 illustrates a metal core substrate based package interconnect system 1100 according to an example embodiment of the present inventive concept. Referring to FIG. 11, the metal core substrate based package interconnect system 1100 can include a metal core substrate 1102 formed from a metal core 1102*a*. The metal core 1102*a* can be etched (I.e., laser ablated) at the top and back side surfaces therein to etch trenches and pockets into the top and back surfaces of the metal core 1102*a*. The etched trenches are preferably formed to create shaped metal pins surrounded by the trenches. The trenches and pockets can then be filled with a dielectric material 1102*c*. This same process can be performed on the back side of the metal core 1102*a* such that metal in-substrate structures 1102*b* and dielectric in-substrate structures 1102*c* are formed therein.

The metal in-substrate structures 1102*b* are formed from the top surface to a back side thereof of the metal core substrate 1102, each being separated by dielectric in-substrate structures 1102*c* such that the metal in-substrate structures 1102*b* can be isolated from each other as well as from the metal core 1102*a*. On both the top surface and the back side of the metal core substrate 1102 can be fabricated an interconnect structure 1104 including patterned dielectric interconnect structures 1104*a* and one or more metal interconnect structures 1104*b*. Here patterned dielectric interconnect structures 1104*a* and some of the metal interconnect structures 1104*b* are fabricated on the top and bottom surfaces of the metal core substrate 1102 to align with several dielectric in-substrate structures 1102*c* and metal in-substrate structures 1102*b* of the metal core substrate 1102. Further, the metal interconnect structures 1104*b* patterned in both the interconnect structures 1104 deposited on the top surface and back side of the metal core substrate 1102 include contacts C connected to exposed ends thereof in order to receive or transmit signals from or to external devices. In the embodiment of FIG. 11 an electronic component EC is connected to two adjacent contacts C connected to exposed ends of metal interconnect structures patterned in the interconnect structure 1104 formed on the top surface of the metal core substrate 1102 in order to receive at least one of a power, a signal or a ground. These power, signal or ground can be received at a contact C connected to a metal interconnect structure 1104*b* patterned in the interconnect structure 1104 formed on the back side of the metal core substrate 1102, travel through this metal interconnect structure 1104*b*, connect with the attached metal in-substrate structure 1102*b*, travel through this metal in-substrate structure 1102*b*, connect with the metal interconnect structure 1104*b* patterned in the interconnect structure 1104 formed on the top surface of the metal core substrate 1102, travel through this metal interconnect structure 1104*b* and travel through the connected contact C, where it can then be received at the electronic component EC. Further, as illustrated in FIG. 11, the second contact C adjacent to the first contact C and disposed on the other metal interconnect structure 1104*b* can receive a ground from the isolated metal in-substate structure 1102*b*. With the plurality of different patterned metal core substrates 1102 according to the present inventive concept, with their metal in-substrate structures 1102*b* being connected to metal interconnect structures 1104*b* patterned into interconnect structures 1104, a plurality of different components can receive various signals to become enabled.

The metal core substrate based package interconnect system provides a lower coefficient of thermal expansion (CTE) and higher Young's modulus substrate than conventional substrate materials. This reduces CTE mismatch between components and the substrate, and reduces substrate warpage, improving overall reliability of the package.

Figure 12A:
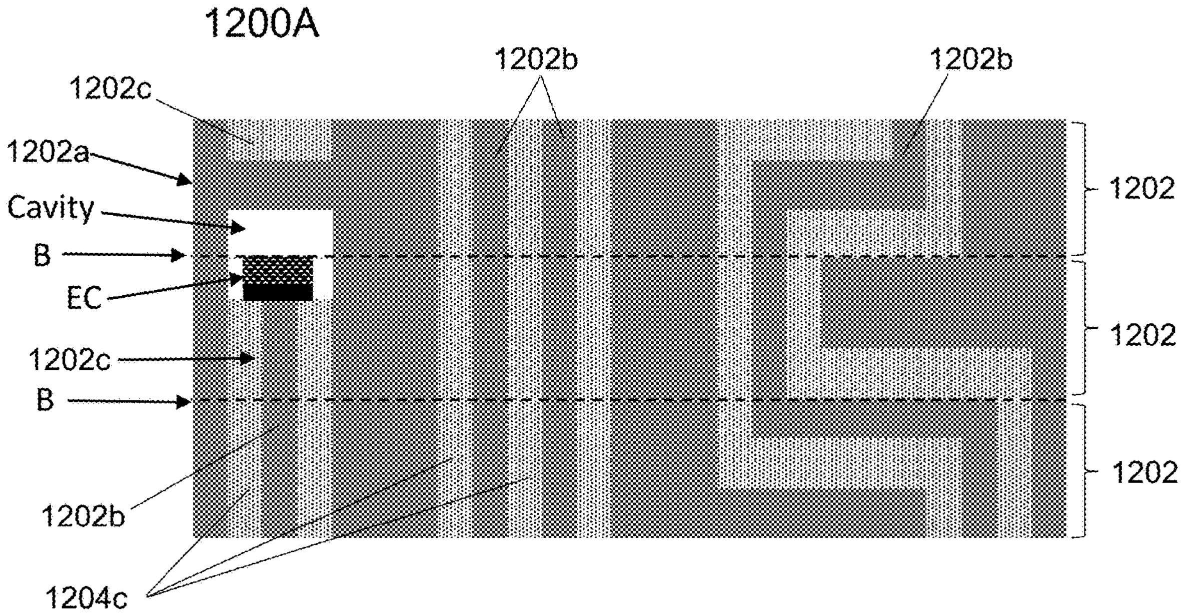
FIG. 12A illustrates a metal core substrate based package interconnect system 1200A according to still another example embodiment of the present inventive concept.

FIG. 12A illustrates a metal core substrate based package interconnect system 1200A according to still another example embodiment of the present inventive concept. Referring to FIG. 12A, the metal core substrate based package interconnect system 1200A can include at least two metal core substrates 1202 each formed of a metal core 1202*a* having metal in-substrate structures 1202*b* and dielectric in-substrate structures 1202*c* patterned therein and/or therethrough. These metal core substrates 1202 can be fabricated via a topside patterning (i.e., laser abating or plasma etching), filling with a dielectric material, and a backside grind or via a topside and backside patterning and filling process.

In this example embodiment the two or more metal core substrates 1202 are each bonded together in a stacking manner. More specifically, a first metal core substrate 1202 (bottom substrate) can be configured to have metal in-substrate structures 1202*b* and dielectric in-substrate structures 1202*c* patterned through a first metal core 1202*a*. A second metal core substrate 1202 (middle substrate) can be configured to be bonded on the top surface of the first metal core substrate 1202 (bottom substrate) and have metal in-substrate structures 1202*b* and dielectric in-substrate structures 1202*c* patterned through a second metal core 1202*a*, as well as having at least one cavity formed therein to embed components therein. In this example embodiment a cavity is formed through the top surface of the second metal core substrate 1202. This cavity extends across a pair of dielectric in-substrate structures 1202*c* and an metal in-substrate structure 1202*b*, wherein the metal in-substrate structure 1202*b* is patterned between the pair of dielectric in-substrate structures 1202*c*. On top of the metal in-substrate structure 1202*b* is a contact C with an electronic component (EC) disposed thereon to receive power through the metal in-substrate structure 1202*b*. Further, a third metal core substrate 1202 (topmost substrate) can be configured to be bonded on the top surface of the second metal core substrate 1202 (middle substrate). This third metal core substrate 1202 (topmost substrate) is configured to have metal in-substrate structures 1202*b* and dielectric in-substrate structures 1202*c* patterned therethrough, as well as having a cavity etched into a back side to align with the cavity etched into the top surface of the second metal core substrate 1202 (middle substrate). This example embodiment is configured when an electronic component is large enough that forming a cavity into one metal core substrate 1202 cannot fully embed the electric component EC. Once the EC is placed within the cavity etched into the second metal core substrate 1202 (middle substrate) the third metal core substrate 1202 (topmost substrate) can be aligned with the second metal core substrate 1202 (middle substrate) such that the EC can be fully embedded within the two aligned cavities. Then the second metal core substrate 1202 (middle substrate) the third metal core substrate 1202 (topmost substrate) can be bonded together to form metal core substrate based package interconnect system 1200A including three metal core substrates 1202 bonded together with aligned dielectric in-substrate structures 1202*c* and an metal in-substrate structures 1202*b*, as well as at least one cavity with an embedded EC therein. The substrates can be bonded together using a metal-to-metal bond, like a Cu to Cu compression bond, or bonded together using a soldering paste. If the multi-layer stack does not require high subsequent process temperatures, then the substrates can be bonded together using a conductive polymer. Additional electronic components (EC) and/or contacts C can be disposed on either side of the metal core substrate based package interconnect system 1200A. The multi-level System-on-Foil stacked interconnected wafers are referred to as Jetty Blocks or Jetty Boards.

The embodiment in 1200A allows for the stacking of metal core substrates in order to produce more complex routing within the resulting stack than is capable in a single metal core substrate. Additionally, it allows for the inclusion of embedded electronic components within the stack.

Figure 12B:
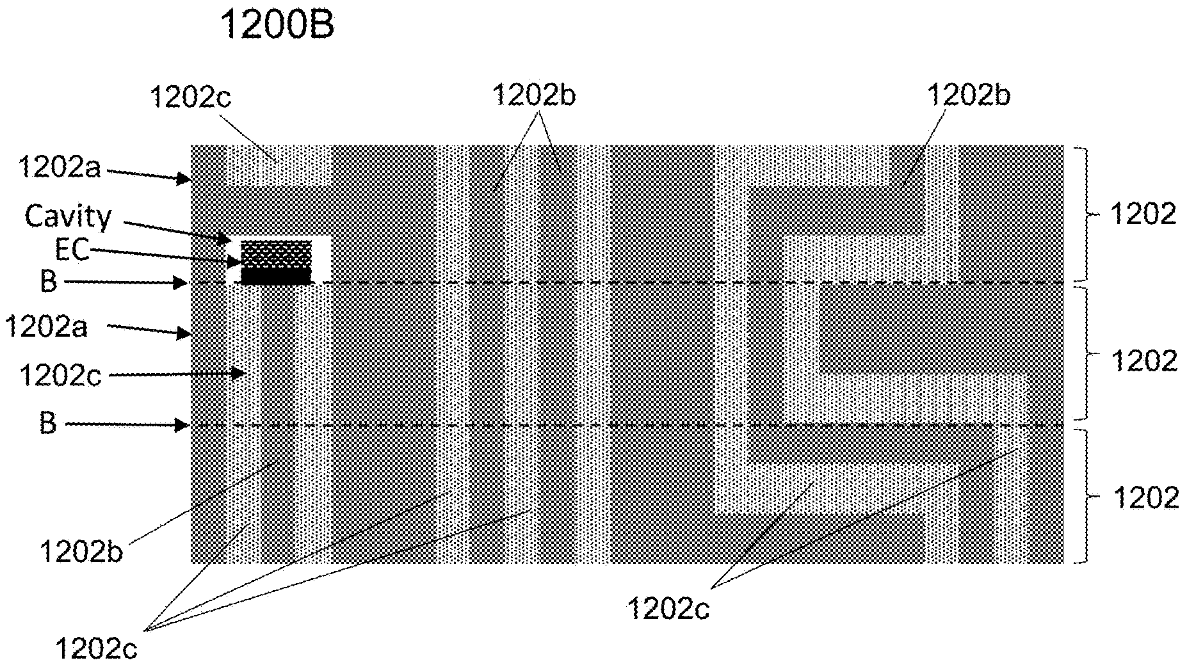
FIG. 12B illustrates a metal core substrate based package interconnect system 1200B according to yet another example embodiment of the present inventive concept.

FIG. 12B illustrates a metal core substrate based package interconnect system 1200B according to yet another example embodiment of the present inventive concept. Referring to FIG. 12B, the metal core substrate based package interconnect system 1200B can include at least two metal core substrates 1202 each formed of a metal core 1202*a* having metal in-substrate structures 1202*b* and dielectric in-substrate structures 1202*c* patterned therein and/or therethrough. These metal core substrates 1202 can be fabricated via a topside patterning (i.e., laser abating or plasma etching), filling with a dielectric material, and a backside grind or via a topside and backside patterning and filling process.

In this example embodiment the two or more metal core substrates 1202 are each bonded together in a stacking manner. More specifically, a first metal core substrate 1202 (bottom substrate) can be configured to have metal in-substrate structures 1202*b* and dielectric in-substrate structures 1202*c* patterned through a first metal core 1202*a*. A second metal core substrate 1202 (middle substrate) can be configured to be bonded on the top surface of the first metal core substrate 1202 (bottom substrate) and have metal in-substrate structures 1202*b* and dielectric in-substrate structures 1202*c* patterned through a second metal core 1202*a*. In this example embodiment dielectric in-substrate structures 1202*c* and metal in-substrate structures 1202*b* are exposed on the top surface of the second metal core substrate 1202 (middle substrate), wherein one of the metal in-substrate structures 1202*b* is patterned between a pair of dielectric in-substrate structures 1202*c*. On top of this metal in-substrate structure 1202*b* is a contact C with an electronic component (EC) disposed thereon to receive power through the metal in-substrate structure 1202*b*. Further, a third metal core substrate 1202 (topmost substrate) can be configured to be bonded on the top surface of the second metal core substrate 1202 (middle substrate). This third metal core substrate 1202 (topmost substrate) is configured to have metal in-substrate structures 1202*b* and dielectric in-substrate structures 1202*c* patterned therethrough, as well as having a cavity etched into a back side thereof. This cavity is aligned to cover and embed the metal in-substrate structure 1202*b* having the contact and the electronic component (EC) disposed thereon. Then the second metal core substrate 1202 (middle substrate) the third metal core substrate 1202 (topmost substrate) can be bonded together to form metal core substrate based package interconnect system 1200A including three metal core substrates 1202 bonded together with aligned dielectric in-substrate structures 1202*c* and an metal in-substrate structures 1202*b*, as well as at least one cavity with an embedded EC therein. metal core substrate based package interconnect system 1200B.

The embodiment in 1200B allows for the stacking of metal core substrates in order to produce more complex routing within the resulting stack than is capable in a single metal core substrate. Additionally, it allows for the inclusion of embedded electronic components within the stack.

Figure 13:
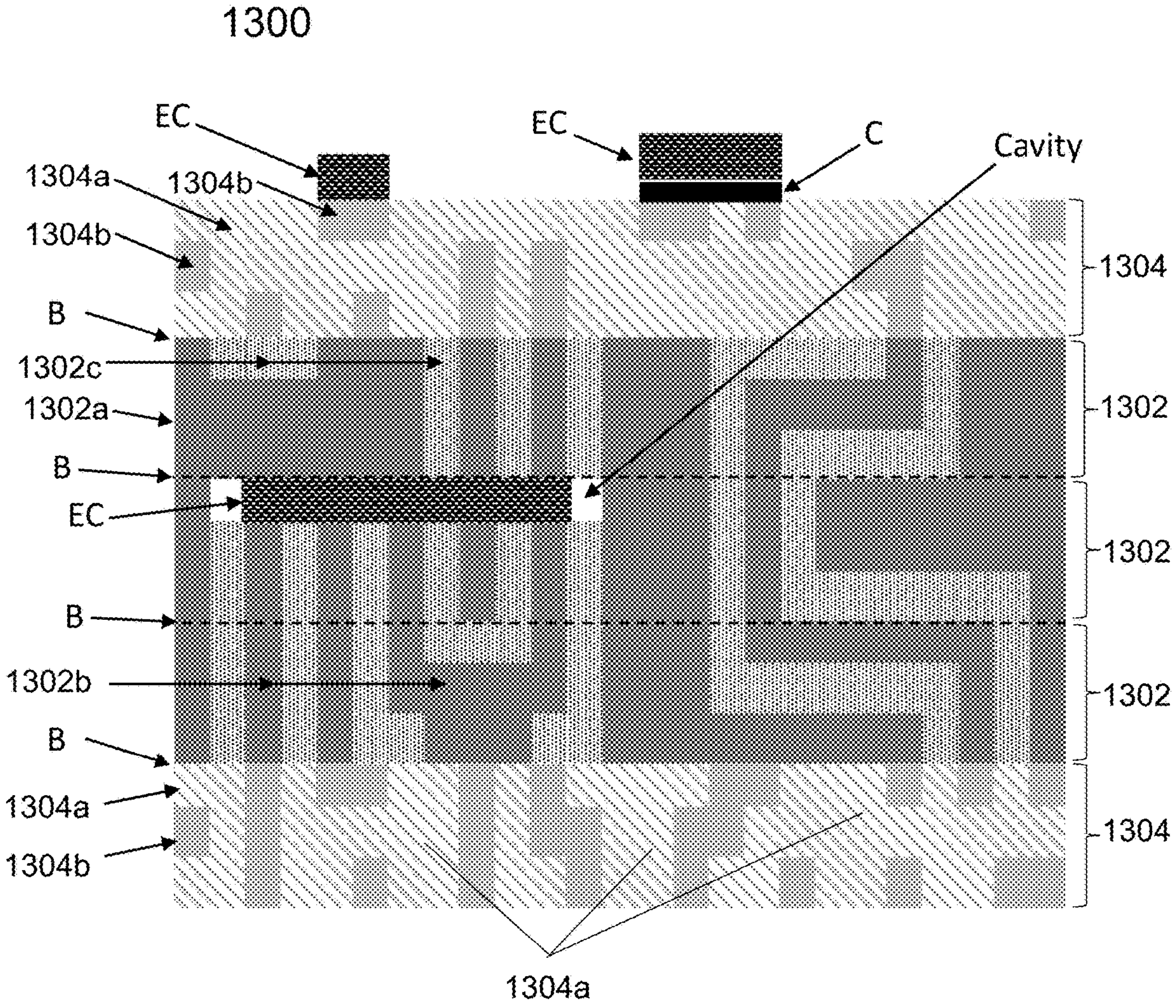
FIG. 13 illustrates a metal core substrate based package interconnect system 1300 according to yet another example embodiment of the present inventive concept.

FIG. 13 illustrates a metal core substrate based package interconnect system 1300 according to yet another example embodiment of the present inventive concept. Referring to FIG. 13, the metal core substrate based package interconnect system 1300 can include at least two metal core substrates 1302 each formed of a metal core 1302*a* having metal in-substrate structures 1302*b* and dielectric in-substrate structures 1302*c* patterned therein and/or therethrough, wherein the at least two metal core substrates 1032 are bonded together in a stacking manner. The metal core substrates 1202 can be fabricated via a topside patterning (i.e., laser abating or plasma etching), filling with a dielectric material, and a backside grind or via a topside and backside patterning and filling process. In this example embodiment three metal core substrates 1302 are bonded directly together in a stacking manner. Further, an interconnect structure 1304 can be deposited on both the top most and bottom most core substrates 1302. The interconnect structures 1304 deposited on the top most and bottom most core substrates 1302 can include dielectric interconnect structures 1304*a* and metal interconnect structures 1304*b* patterned therein and/or therethrough. Predetermined ones of the dielectric interconnect structures 1304*a* and metal interconnect structures 1304*b* can be connected to predetermined ones of the dielectric in-substrate structures 1302*c* and metal in-substrate structures 1302*b* of the metal core substrates 1302 to form electrical lines extending through the metal core substrates 1302 and the interconnect structure 1304, as illustrated. Further, one of more of the metal core substrates 1302 can have at least one cavity etched therein which houses a corresponding electronic component (EC), wherein the at least one EC is electronically connected to at least one metal in-substrate structure 1302*b* to receive a signal therefrom. In an example embodiment the at least one EC can receive an electronic signal through a metal interconnect structure 1304*b* and a metal in-substrate structure 1302*b*, which are connected together. The interconnect structures 1304 deposited on the top most and/or bottom most core substrates 1302 can have external components electronically connected to metal interconnect structures 1304*b* patterned therein via contacts connected to the external components and the metal interconnect structures 1304*b*.

The embodiment in 1300 allows for the stacking of metal core substrates in order to produce more complex routing within the resulting stack than is capable in a single metal core substrate. Additionally, it allows for the inclusion of embedded electronic components within the stack. This stack can be fabricated in wafer format so that wafer-based interconnect structures can then be patterned on the top and back sides, enabling even more routing capacity and attachment of surface components.

Figure 14:
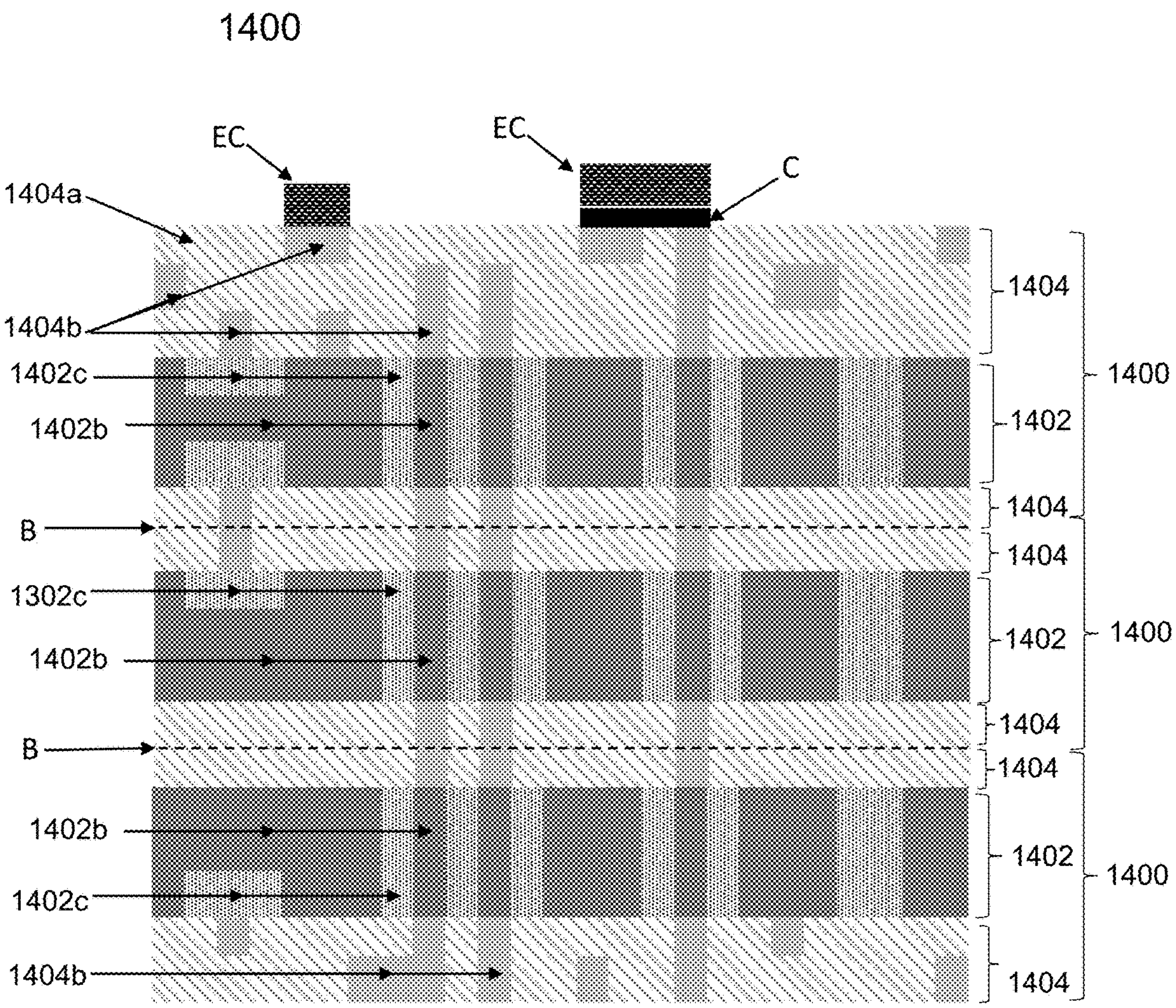
FIG. 14 illustrates a multi-metal core substrate based package interconnect system according to yet another example embodiment of the present inventive concept.

FIG. 14 illustrates a multi-metal core substrate based package interconnect system according to yet another example embodiment of the present inventive concept. Referring to FIG. 14, the multi-metal core substrate based package interconnect system can include multiple metal core substrate based package interconnect systems 1400 bonded together at respective interconnect structures 1404. More specifically, each metal core substrate based package interconnect system 1400 can include an interconnect structure 1404 deposited on both a top surface and a back side of a metal core substrate 1402 such that patterned dielectric interconnect structures 1404*a* and metal interconnect structures 1404*b* of the interconnect structure 1404 are fabricated on the top and bottom surfaces of the metal core substrate 1402 to connect with respective ones of dielectric in-substrate structures 1402*c* and metal in-substrate structures 1402*b* of the metal core substrate 1402. The dielectric interconnect structures 1404*a* and metal interconnect structures 1404*b* of the interconnect structure 1404 are fabricated on the top and bottom surfaces of the metal core substrate 1402 to connect with respective ones of dielectric in-substrate structures 1402*c* and metal in-substrate structures 1402*b* of the metal core substrate 1402.

The embodiment in 1400 allows for the stacking of multiple metal core substrate based package interconnect systems in order to produce more complex routing and capability than possible in a single metal core substrate based package interconnect system. Electronic components can be attached to the uppermost or bottommost interconnect structures.

Figure 15:
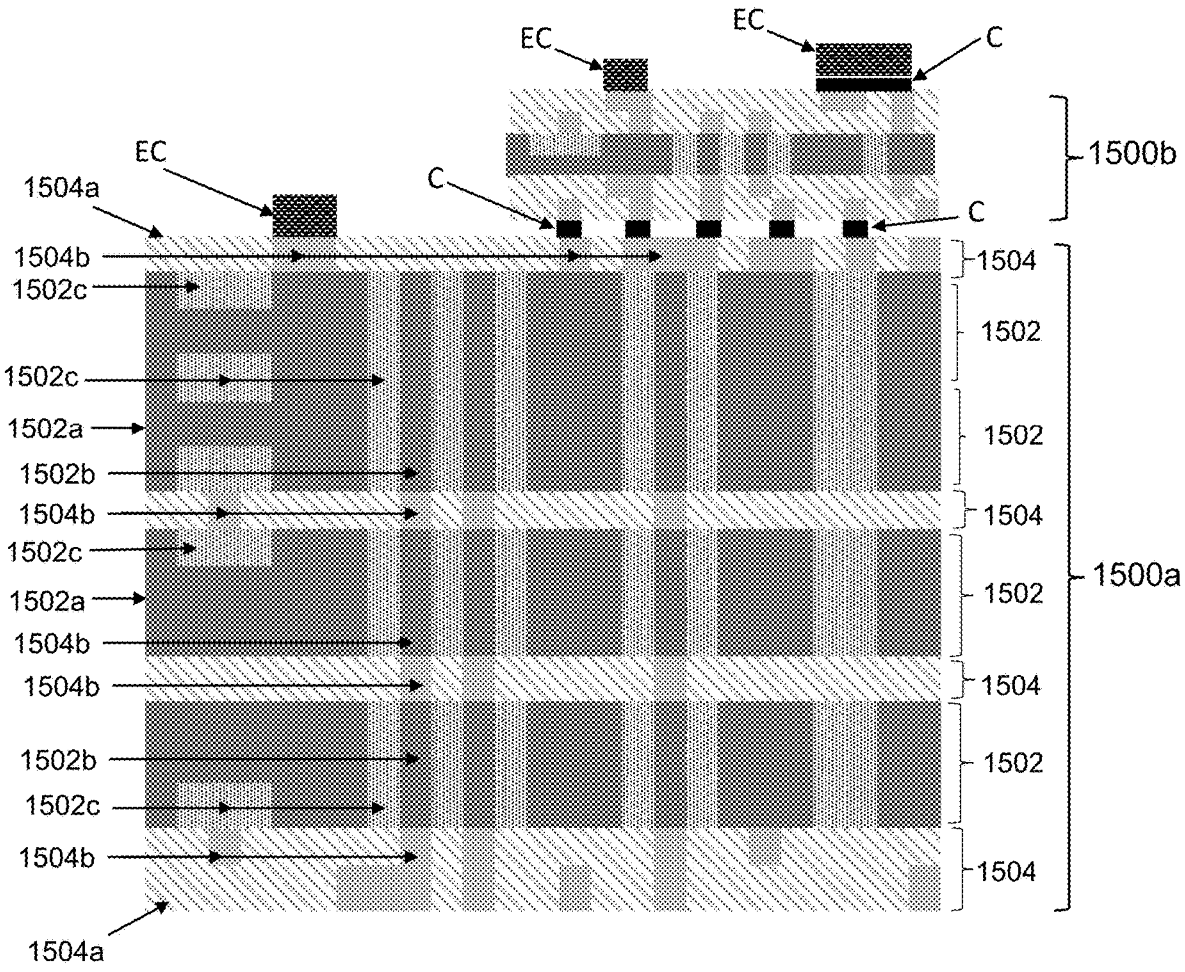
FIG. 15 illustrates a multi-metal core substrate based package interconnect system according to still another example embodiment of the present inventive concept.

FIG. 15 illustrates a metal core substrate based package interconnect system according to yet another example embodiment of the present inventive concept. Referring to FIG. 15, the metal core substrate based package interconnect system can include multiple metal core substrates 1502 and multiple interconnect structures 1504 bonded together in a varied order to form at least part of a first metal core substrate based package interconnect system 1500*a*. More specifically, according to this example embodiment, two metal core substrates 1502 can be bonded directly together such that at least one dielectric isolation pocket (DIP) 1502*c* is formed therebetween to form an enclosed DIV 1502*c*, as well as metal in-substrate structures 1502*b* and dielectric in-substrate structures 1502*c* patterned in the two metal core substrates 1502 connected to each other.

On opposite surfaces of the two metal core substrates 1502 (the surfaces metal core substrates 1502 which are not bonded to each other) can be deposited an interconnect structure 1504 having metal interconnect structures 1504*b* connected to the metal in-substrate structures 1502*b* of both metal core substrates 1502 and dielectric interconnect structures 1504*c* patterned between the metal interconnect structures 1504*b*. Some of the metal interconnect structures 1504*b* patterned in one of the interconnect structures 1504 can have contacts C connected thereto. Connected to the contacts can be metal in-substrate structures 1502*b* of a second metal core substrate based package interconnect system 1500*b* having a metal core substrate 1502 and an interconnect structure 1504 deposited on a top surface and back side thereof. As such, signals, power and ground can pass through the metal in-substrate structures 1502*b* of the two directly bonded metal core substrates 1502, through the metal interconnect structures 1504*b* of the interconnect structures 1504 deposited on the metal core substrates 1502, through the contacts, and through the metal interconnect structures 1504*b* and the metal in-substrate structures 1502*b* of the second metal core substrate based package interconnect system 1500. Further, additional contacts C can be connected to at least one of metal interconnect structures 1504*b* which are exposed at a top surface of the second metal core substrate based package interconnect system 1500*b*. On these contacts C can be connected additional electronic components EC.

The interconnect structure 1504 deposed on the other side of the two bonded metal core substrates 1502 of the first metal core substrate based package interconnect system 1500*a* can include additional metal core substrates 1502 and interconnect structures 1504 connected thereto, with metal in-substrate structures 1502*b* and metal interconnect structures connected together.

Here, one package interconnect system is being used as a board to support the connection of at least one other package interconnect system, operating as a package. The benefit is that both the board and the package have the same metal cores and so the same CTE, which minimizes thermomechanical stress formation and improves reliability.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A metal core substrate based package interconnect system (PIS), comprising:

a metal core substrate consisting of a metal core and metal in-substrate structures patterned within the metal core substrate, each of the metal in-substrate structures comprising a respective patterned portion of the same metal core, and a dielectric material patterned in the metal core substrate to isolate each of the metal in-substrate structures from the metal core; and first and second interconnect structures respectively bonded to a first surface of the metal core substrate and a second surface of the metal core substrate, each of the first and second interconnect structures including an insulation material patterned with a plurality of metal interconnect structures formed therethrough, at least one of the metal interconnect structures from one of the first and second interconnect structures being electronically bonded to at least one metal in-substrate structure at the first surface of the metal core substrate and at least two metal interconnect structures from the other one of the first and second interconnect structures being electronically bonded to at least one metal in-substrate structure at the second surface of the metal core substrate to form at least one package interconnect component (PIC).

2. The metal core substrate based package interconnect system (PIS) according to claim 1, wherein the at least one package interconnect component is a differential PIC.

3. The metal core substrate based package interconnect system (PIS) according to claim 1, wherein the at least one package interconnect component is a signal array PIC.

4. The metal core substrate based package interconnect system (PIS) according to claim 1, wherein the at least one package interconnect component (PIC) is a multi-distribution PIC for one of a signal, power, or ground line.

5. The metal core substrate based package interconnect system (PIS) according to claim 1, wherein the at least one package interconnect component is an optical waveguide PIC.

6. The metal core substrate based package interconnect system (PIS) according to claim 1, wherein the at least one package interconnect component is an array PIC.

7. The metal core substrate based package interconnect system (PIS) according to claim 1, wherein the insulation material of at least one of the interconnect structures is formed of an inorganic or organic dielectric material.

8. The metal core substrate based package interconnect system according to claim 1, further comprising:

a second metal core substrate based package interconnect system connected to a top surface of the metal core substrate based package interconnect system by bonding a top surface of the interconnect structure of the metal core substrate based package interconnect system to a back side surface of an interconnect structure of the second metal core substrate based package interconnect system such that metal interconnect structures from the metal core substrate based package interconnect system are electronically connected to metal interconnect structures of the second metal core substrate based package interconnect system.

9. The metal core substrate based package interconnect system according to claim 8, further comprising:

a third metal core substrate based package interconnect system connected to a top surface of the second metal core substrate based package interconnect system through contacts configured to connect metal interconnect structures of the second metal core substrate based package interconnect system and metal interconnect structures of the third metal core substrate based package interconnect system.

10. The metal core substrate based package interconnect system according to claim 9, further comprising:

an electronic component attached to a top surface of the third metal core substrate based package interconnect system through contacts connected to metal interconnect structures patterned therein, wherein the electronic component receives signals through metal in-substrate structures patterned in the metal core substrate based package interconnect system, second metal in-substrate structures patterned in the second metal core substrate based package interconnect system, and third metal in-substrate structures patterned in the third metal core substrate based package interconnect system.

11. The metal core substrate based package interconnect system according to claim 1, further comprising:

contacts connected to at least two exposed metal interconnect structures of the metal interconnect structures patterned in the interconnect structure bonded to the second surface of the metal core substrate; and a component attached to the two contacts to receive signals that pass through at least two metal in-substate structures of the metal in-substrate structures before passing through the at least two exposed metal interconnect structures.

12. A metal core substrate based package interconnect system (PIS), comprising:

a first metal core substrate including a first metal core and first metal in-substrate structures patterned therein and comprising respective patterned portions of the same metal body as the first metal core, and first dielectric in-substrate structures patterned therein to isolate each of the first metal in-substrate structures from the first metal core; and a second metal core substrate including a second metal core and second metal in-substrate structures patterned therein and comprising respective patterned portions of the same metal body as the second metal core, and second dielectric in-substrate structures patterned therein to isolate each of the second metal in-substrate structures from the second metal core, wherein at least part of a top surface of the second metal core substrate is bonded to at least part of a back side surface of the first metal core substrate such that the at least one of the first metal in-substrate structures and at least one of the second metal in-substrate structures are aligned to form at least one single metal in-substrate structure and at least one single dielectric in-substrate structure.

13. The metal core substrate based package interconnect system (PIS) according to claim 12, further comprising:

a cavity formed in at least one of the top surface of the second metal core substrate and the back side surface of the first metal core substrate; and a component embedded within the cavity such that the component is electronically or optically connected to at least one of the metal in-substrate structures or dielectric in-substrate structures patterned through either the first metal core substrate or the second metal core substrate.

14. The metal core substrate based package interconnect system (PIS) according to claim 13, further comprising:

a third metal core substrate having at least part of a top surface thereof bonded to at least part of a back side surface of the second metal core substrate such that the at least one metal in-substrate structure of the third meal core substrate and at least one metal in-substrate structure of the second metal core substrate are aligned to form at least one single metal in-substrate structure and the component receives a signal through the metal in-substrate structures connected between the third and second metal core substrates.

15. The metal core substrate based package interconnect system (PIS) according to claim 14, further comprising:

an interconnect structure deposited on a back side surface of the third metal core substrate and including at least one dielectric interconnect structure and at least one metal interconnect structure patterned therethrough, the at least one dielectric interconnect structure and the al least one metal interconnect structure being aligned with and in contact with at least one dielectric in-substrate structure and at least metal in-substrate structure of the third metal core substrate, respectively, wherein the component receives a signal through the metal in-substrate structures connected together from the second and third metal core substrates and through the at least one metal interconnect structure patterned through the interconnect structure.

16. The metal core substrate based package interconnect system (PIS) according to claim 12, further comprising:

an interconnect structure deposited on at least one of a top surface of the first metal core substrate and a back side of the second metal core substrate, the at least one interconnect structure including at least one dielectric interconnect structure and at least one metal interconnect structure patterned therethrough, the at least one dielectric interconnect structure and the at least one metal interconnect structure being aligned with and in contact with at least one corresponding dielectric in-substrate structure and at least one corresponding metal in-substrate structure, respectively, of the corresponding one of the first metal core substrate and the second metal core substrate on which the at least one interconnect structure is deposited.

17. The metal core substrate based package interconnect system according to claim 16, further comprising:

contacts connected to at least two exposed metal interconnect structures patterned in an interconnect structure bonded to a top surface of the first metal core substrate; and a component attached to the two contacts to receive signals that pass through the first and second metal core substrates before passing through the at least two exposed metal interconnect structures.

* * * * *